(12) United States Patent
Uemura et al.

(10) Patent No.: US 9,287,857 B2
(45) Date of Patent: Mar. 15, 2016

(54) SEMICONDUCTOR DEVICE

(71) Applicant: FUJITSU SEMICONDUCTOR LIMITED, Yokohama-shi, Kanagawa (JP)

(72) Inventors: Taiki Uemura, Kawasaki (JP); Yoshiharu Tosaka, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/337,514

(22) Filed: Jul. 22, 2014

(65) Prior Publication Data

US 2014/0333363 A1 Nov. 13, 2014

Related U.S. Application Data

(60) Division of application No. 12/765,469, filed on Apr. 22, 2010, now Pat. No. 8,816,739, which is a continuation of application No. PCT/JP2007/071931, filed on Nov. 12, 2007.

(51) Int. Cl.
| | |
|---|---|
| *H03K 3/356* | (2006.01) |
| *H03K 3/3562* | (2006.01) |
| *H03K 3/013* | (2006.01) |

(52) U.S. Cl.
CPC ............ *H03K 3/35625* (2013.01); *H03K 3/013* (2013.01); *H03K 3/35606* (2013.01)

(58) Field of Classification Search
CPC ........... G06F 1/04; G06F 1/08; H03K 23/667; H03K 3/012
See application file for complete search history.

(56) References Cited

U.S. PATENT DOCUMENTS

| | | | |
|---|---|---|---|
| 5,436,572 | A | 7/1995 | Sugiyama |
| 5,508,634 | A | 4/1996 | Sugiyama |
| 5,812,002 | A | 9/1998 | Yoshida |
| 7,064,398 | B2 | 6/2006 | Yokoyama |
| 7,295,459 | B2 | 11/2007 | Islam |
| 7,327,169 | B2 * | 2/2008 | Osame et al. ................. 345/104 |
| 7,514,737 | B2 | 4/2009 | Yokoyama |
| 7,612,594 | B2 | 11/2009 | Fukuoka |
| 7,999,800 | B2 | 8/2011 | Iwabuchi et al. |
| 8,476,949 | B2 | 7/2013 | Chung et al. |
| 2005/0141265 | A1 | 6/2005 | Yokoyama |
| 2006/0039176 | A1 | 2/2006 | Islam |
| 2006/0095975 | A1 | 5/2006 | Yamada et al. |

(Continued)

FOREIGN PATENT DOCUMENTS

| | | | |
|---|---|---|---|
| JP | 03-192915 A | | 8/1991 |
| JP | 06-013852 A | | 1/1994 |

(Continued)

OTHER PUBLICATIONS

International Search Report of PCT/JP2007/071931, mailing date of Dec. 11, 2007.

(Continued)

*Primary Examiner* — Sibin Chen
(74) *Attorney, Agent, or Firm* — Westerman, Hattori, Daniels & Adrian, LLP

(57) ABSTRACT

There is provided a semiconductor device having: a latch circuit having a plurality of data holding nodes; a first capacitance element connected to the first data holding node included in the plurality of data holding nodes; and a first switch element provided between the first data holding node and the first capacitance element.

5 Claims, 31 Drawing Sheets

(56) References Cited

U.S. PATENT DOCUMENTS

| | | |
|---|---|---|
| 2006/0192254 A1 | 8/2006 | Yokoyama |
| 2007/0085585 A1* | 4/2007 | Frederick ............... 327/218 |
| 2008/0136481 A1* | 6/2008 | Chung et al. ............ 327/201 |
| 2009/0189209 A1 | 7/2009 | Yokoyama |

FOREIGN PATENT DOCUMENTS

| | | |
|---|---|---|
| JP | 6-237151 A | 8/1994 |
| JP | 9-8612 A | 1/1997 |
| JP | 10-512112 A | 11/1998 |
| JP | 2004-363460 A | 12/2004 |
| JP | 2005-191454 A | 7/2005 |
| JP | 2006-050208 A | 2/2006 |
| JP | 2006-59523 A | 3/2006 |
| JP | 2006-060847 A | 3/2006 |
| WO | 96/21272 A1 | 7/1996 |

OTHER PUBLICATIONS

Notification of Transmittal of Translation of the International Preliminary Report on Patentability (Form PCT/IB/338) of International Application No. PCT/JP2007/071931 mailed Jul. 8, 2010 with Forms PCT/IB/373 and PCT/ISA/237.

Japanese Office Action dated Jul. 10, 2012, issued in corresponding Japanese Patent Application No. 2009-540985, (3 pages). With English Summary.

* cited by examiner

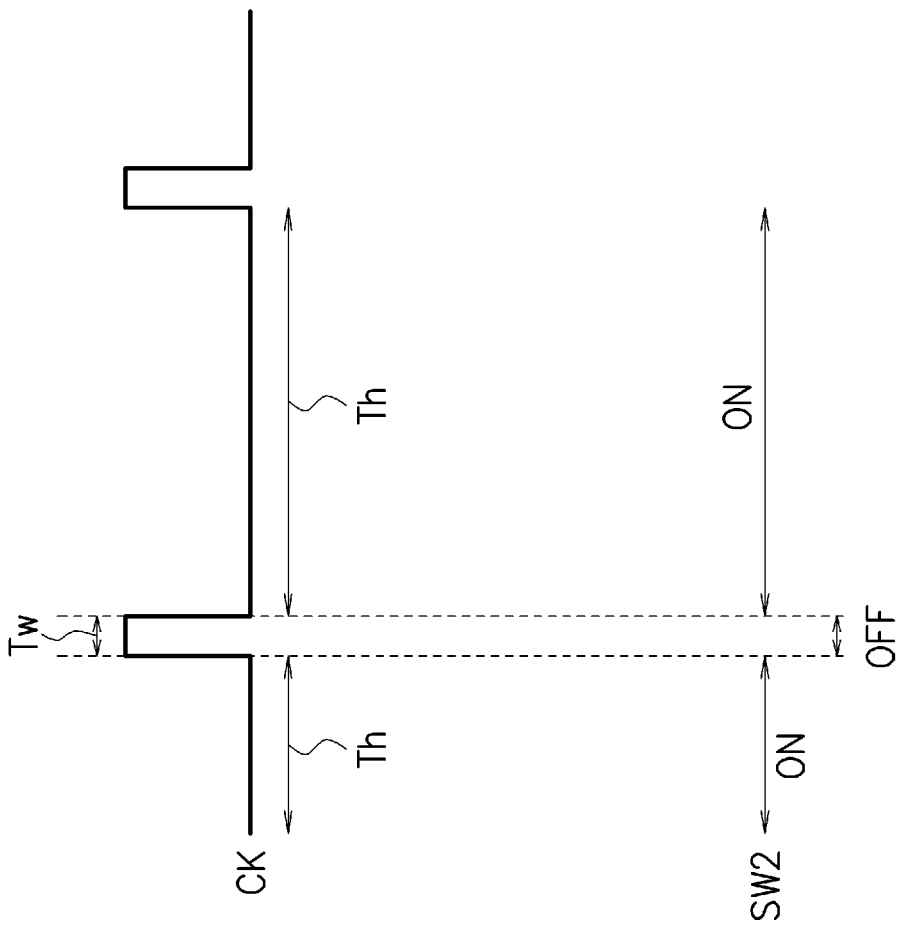
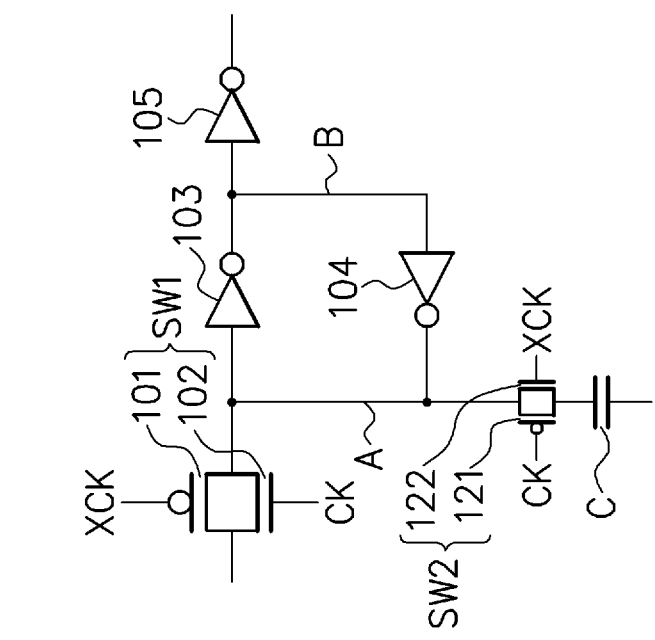

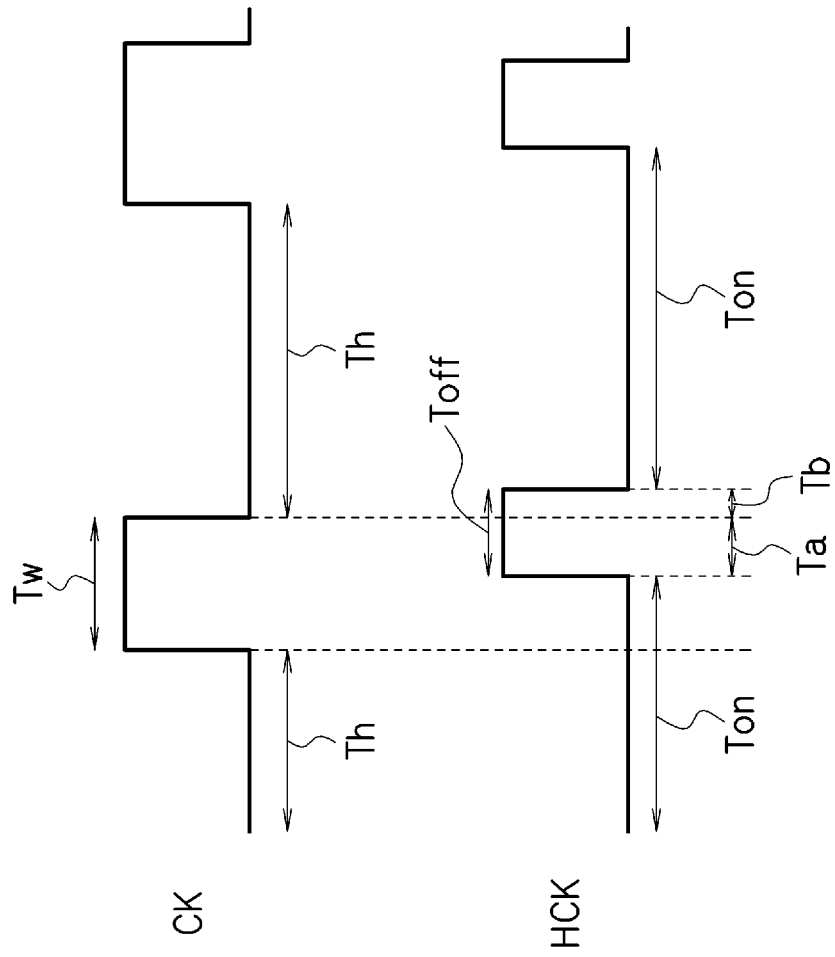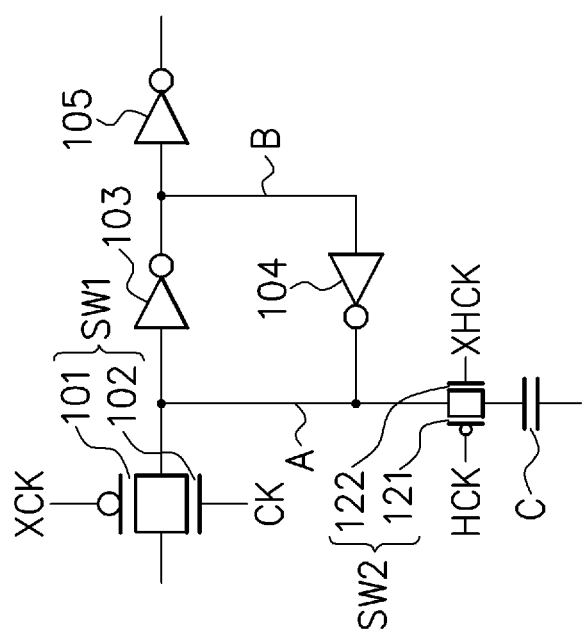

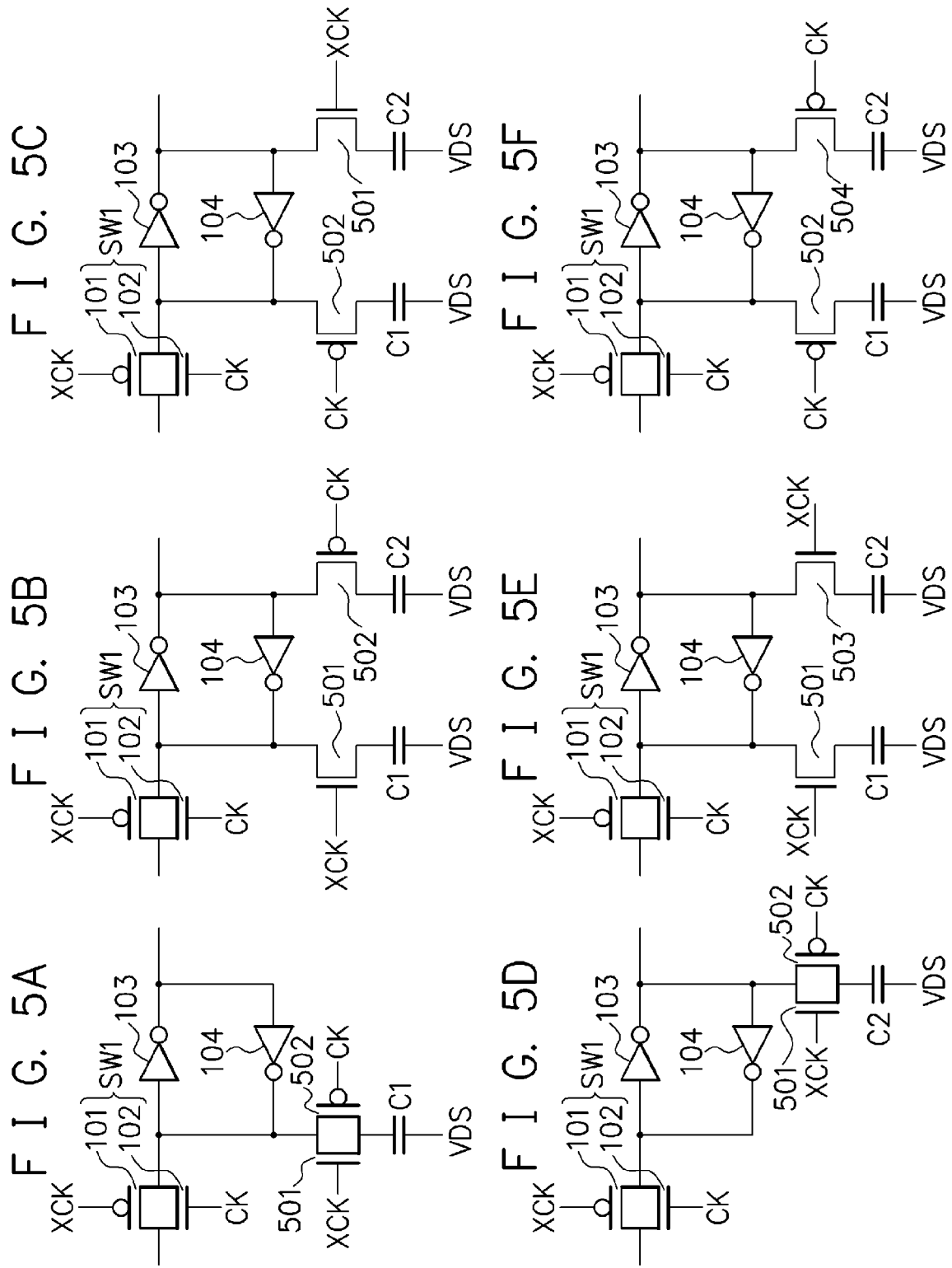

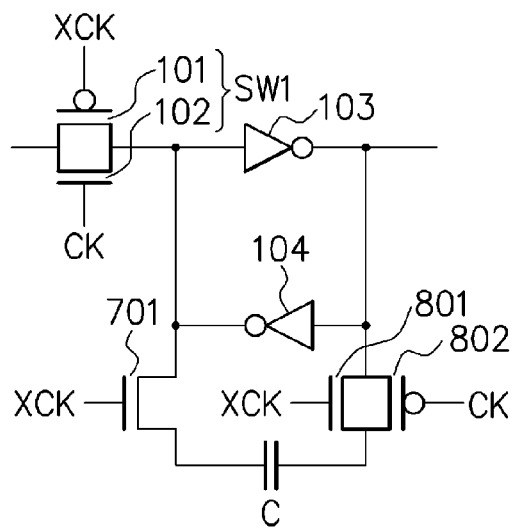
F I G. 8A
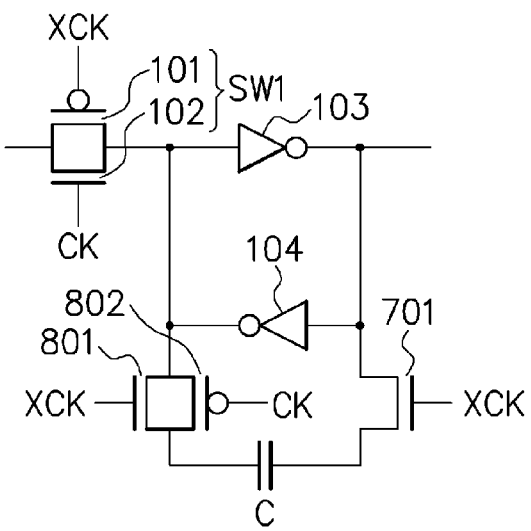
F I G. 8B
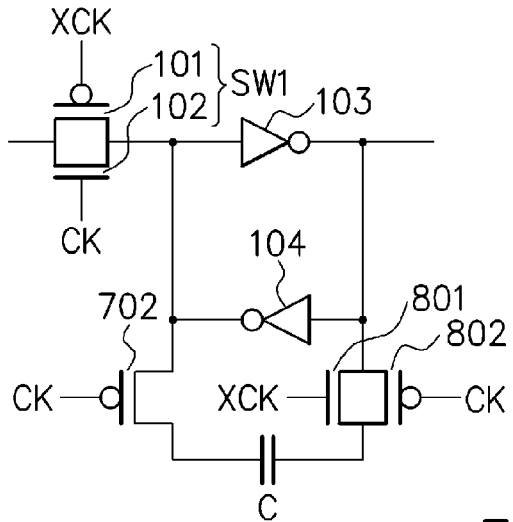
F I G. 8C
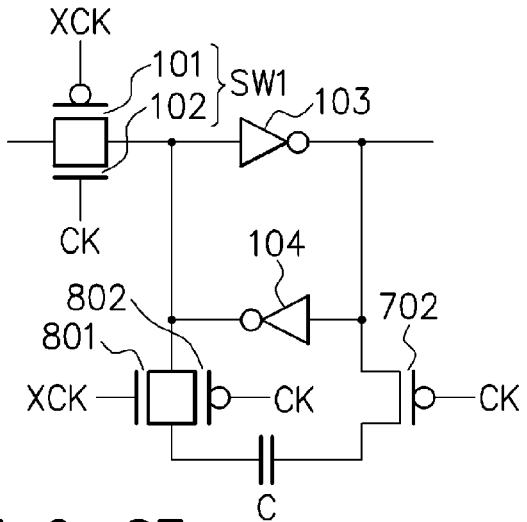
F I G. 8D
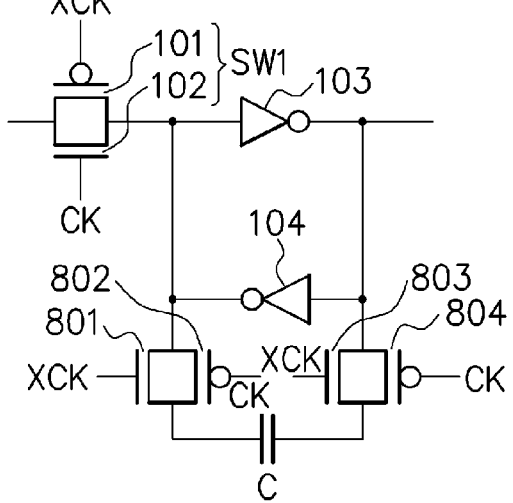
F I G. 8E

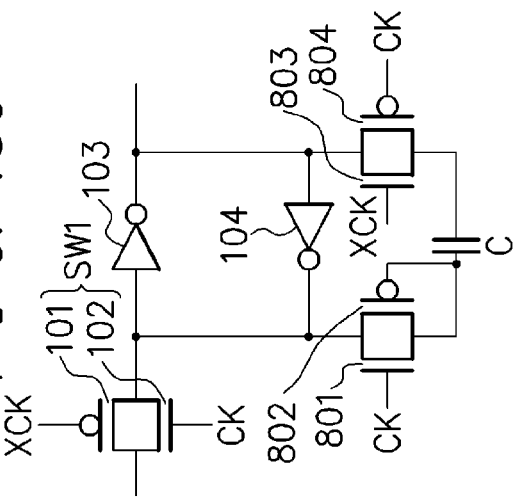
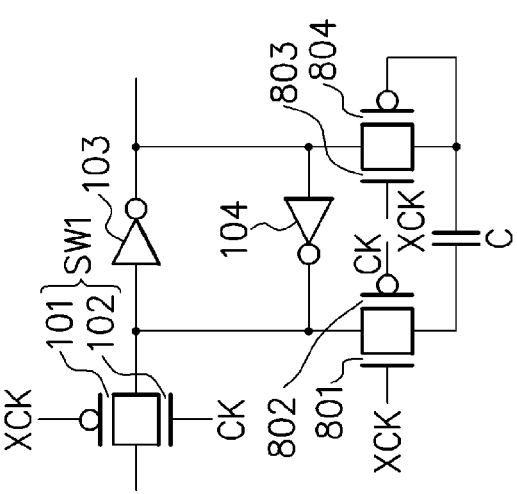
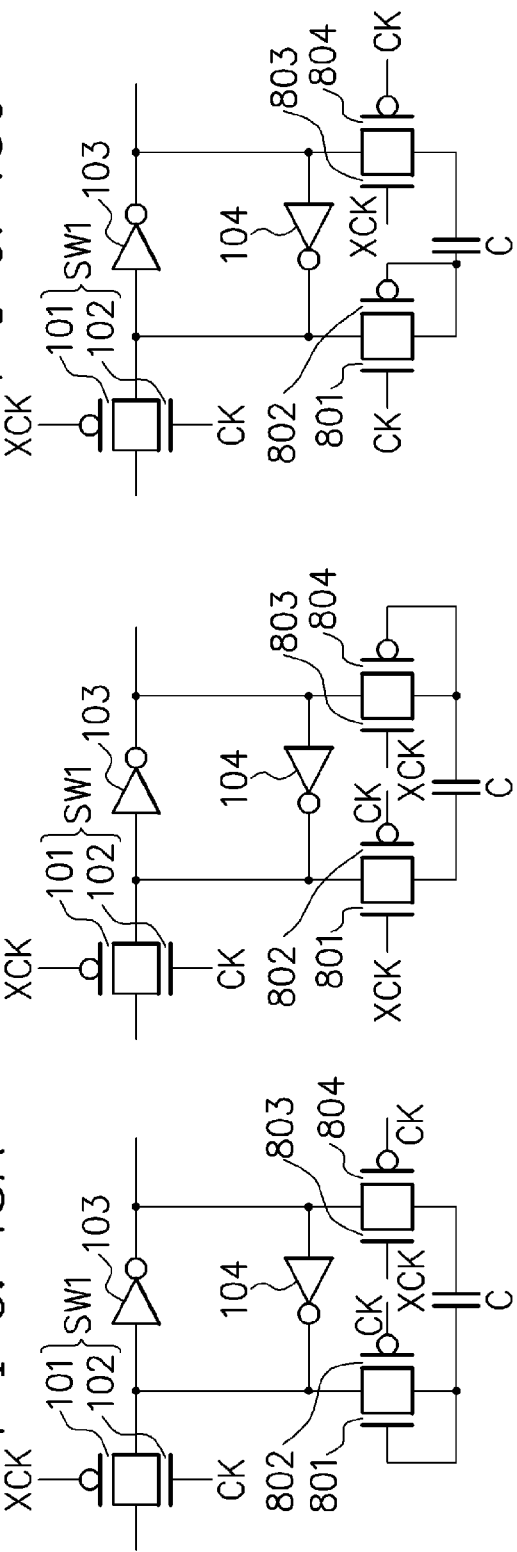
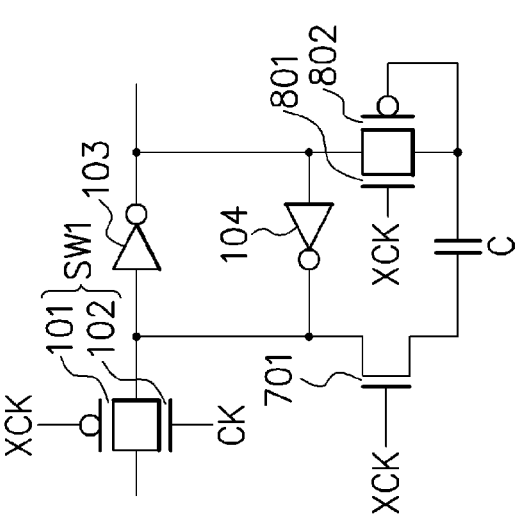
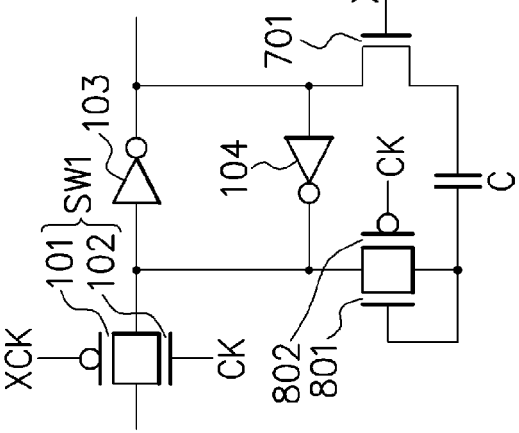
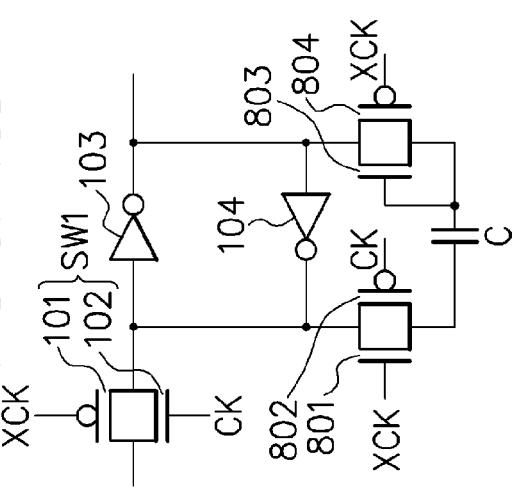

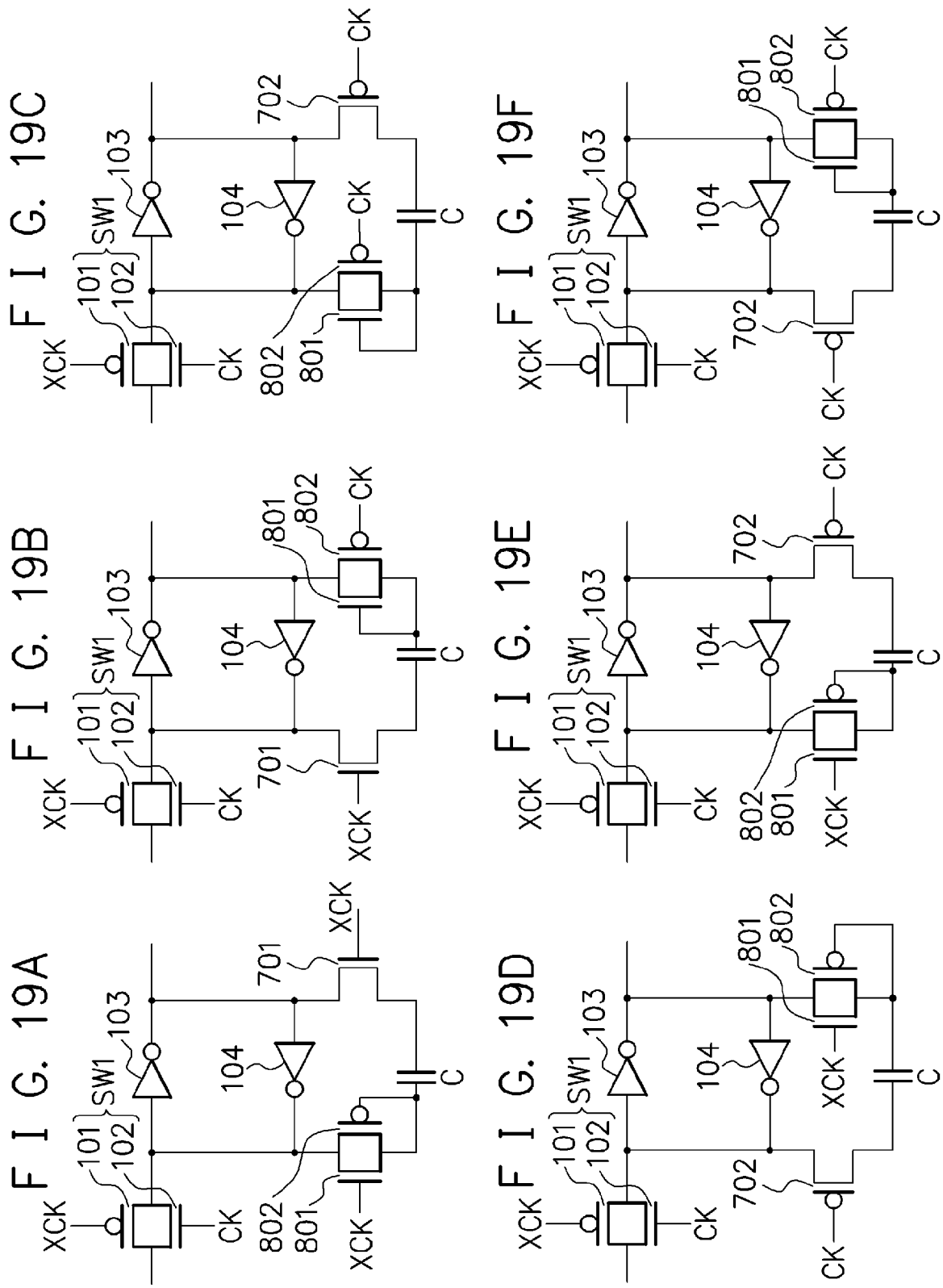

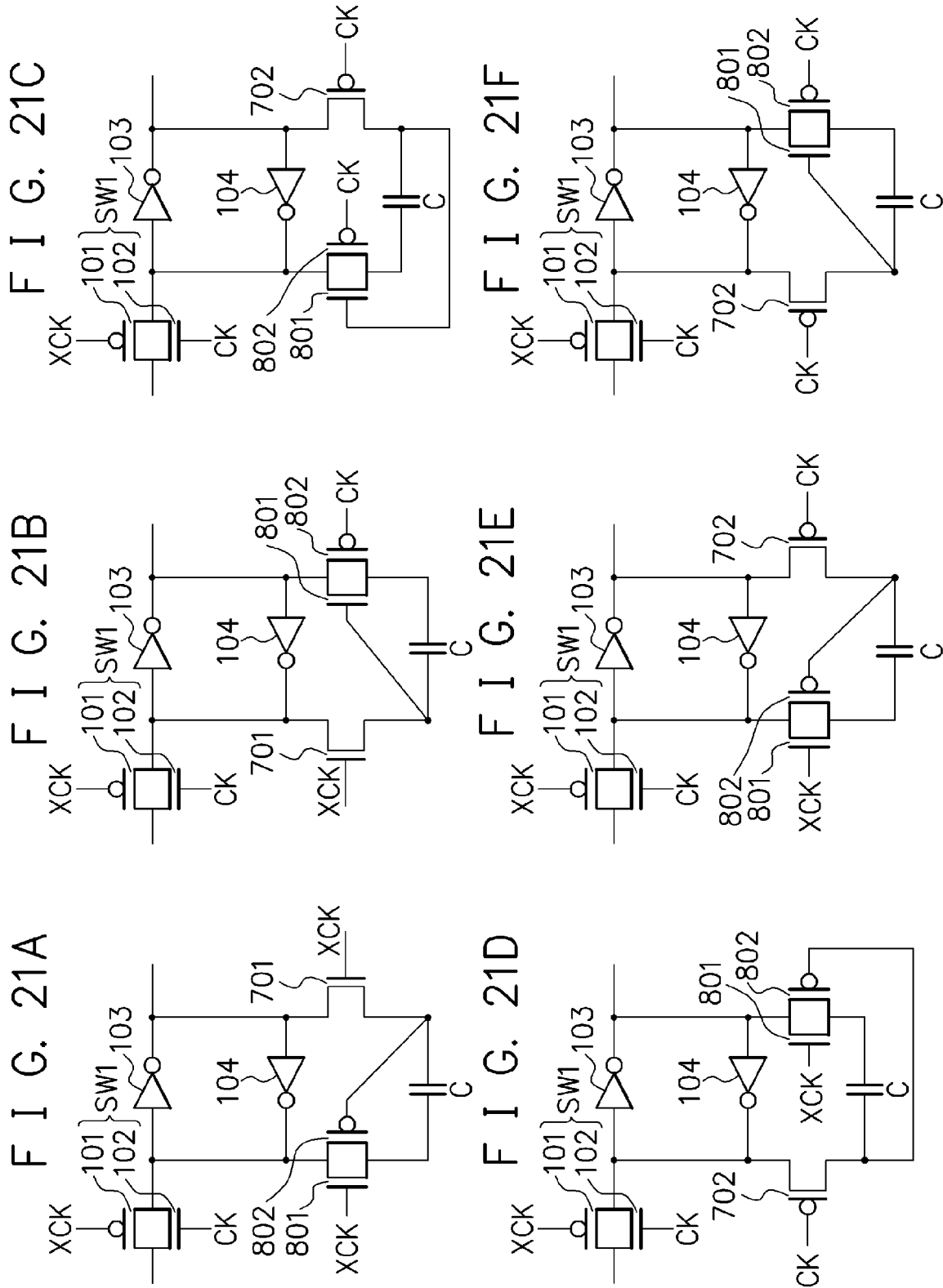

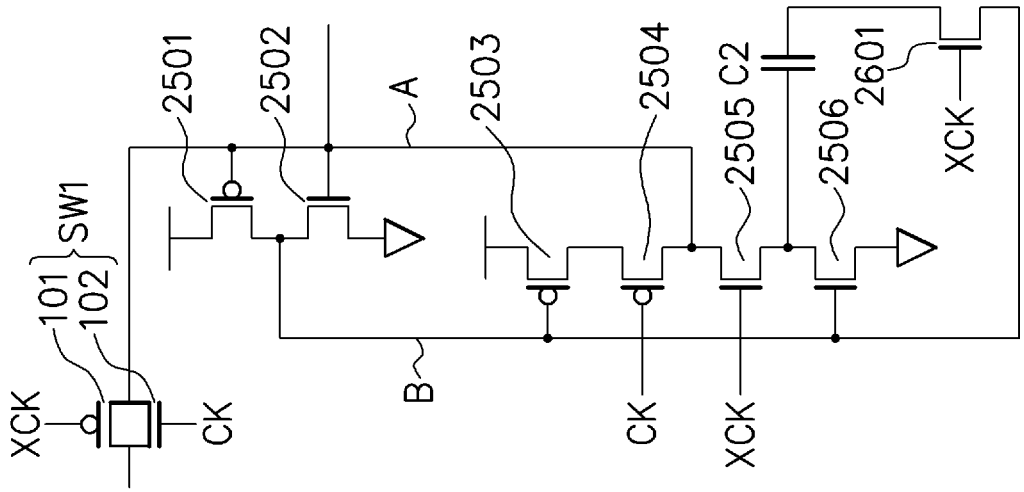
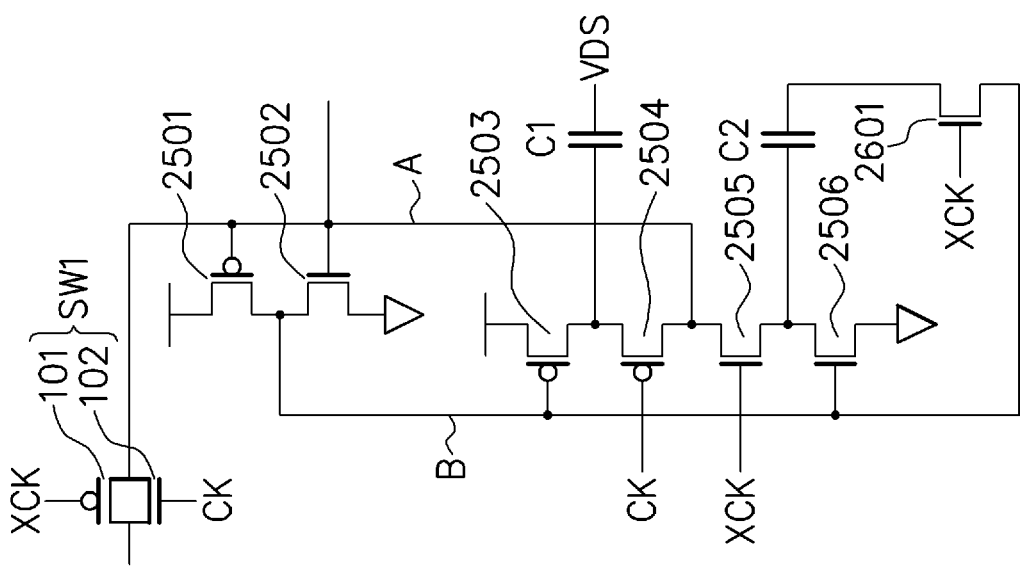
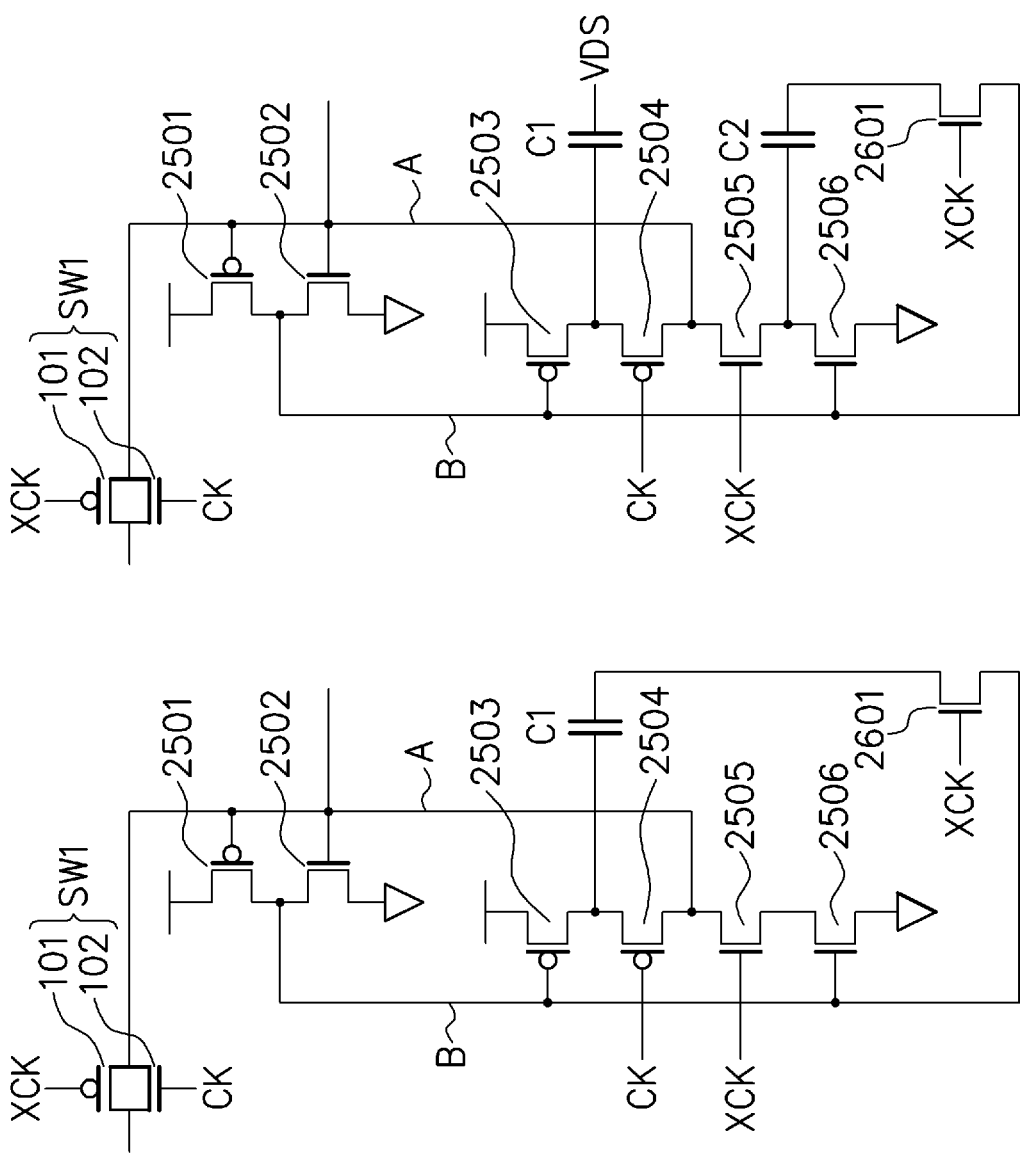

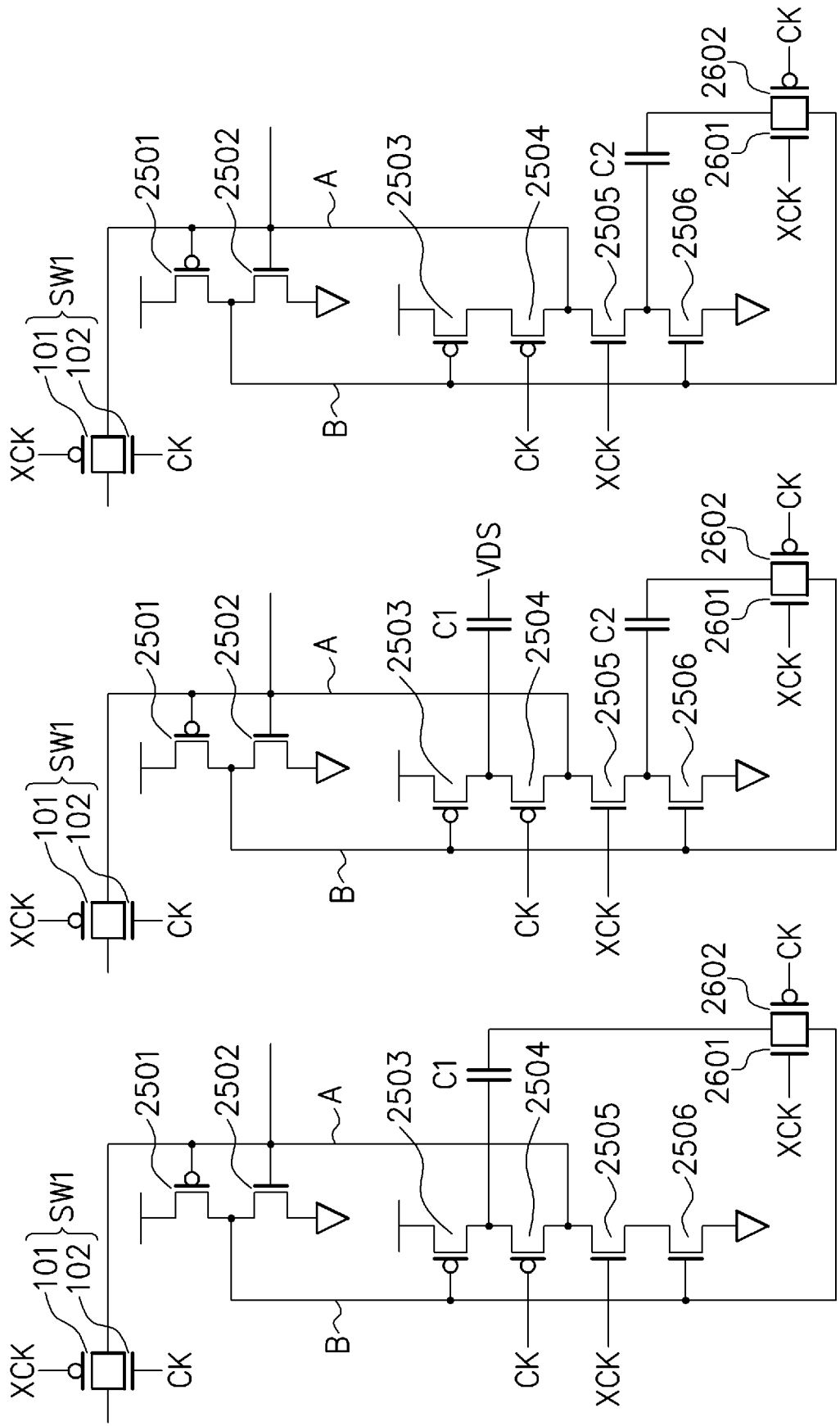

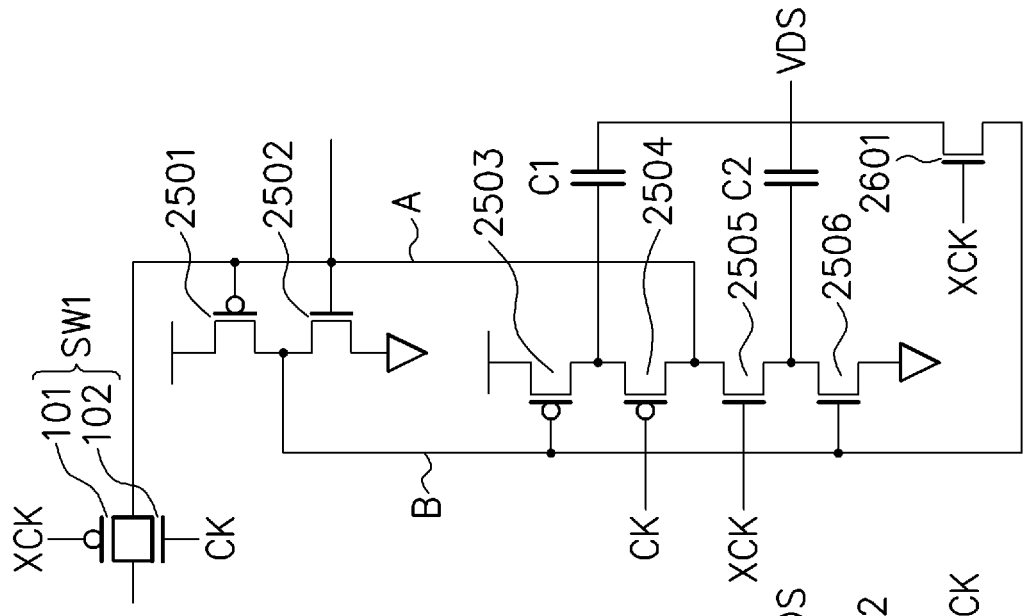
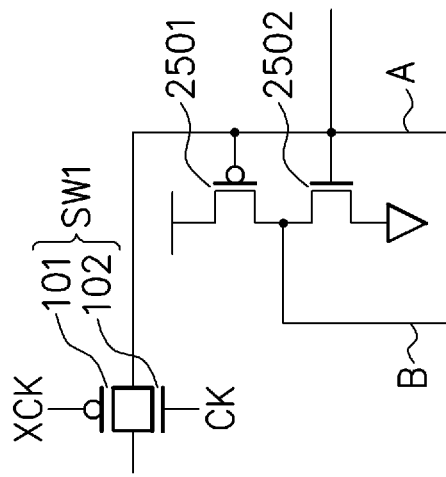
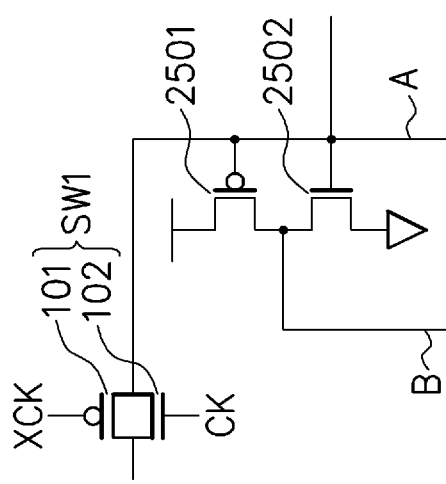

SEMICONDUCTOR DEVICE

CROSS-REFERENCE TO RELATED APPLICATIONS

This application is a divisional of U.S. application Ser. No. 12/765,469 filed on Apr. 22, 2010, which is is a Continuation of International Application No. PCT/JP2007/071931, with an international filing date of Nov. 12, 2007, which designating the United States of America, the entire contents of which are incorporated herein by reference.

FIELD

The present embodiment relates to a semiconductor device.

BACKGROUND

A soft error means, differently from a hard error in which a specific portion of a circuit is permanently destroyed, a temporary malfunction from which an operation can be recovered, the temporary malfunction randomly occurring in a semiconductor chip. An incidence of a neutron ray being a secondary cosmic ray, an alpha ray from an LSI material or the like causes the soft error.

Presently, various countermeasures are considered against the soft error. As the most effective and general countermeasure, there is a method of adopting a circuit configuration which does not effect a system even if an error occurs. For example, in an Error Correction Code (ECC) circuit, an error may be corrected comparatively easily. However, these countermeasures involve area increase, and moreover, are difficult to be applied to a logic circuit. Therefore, if a soft error ratio increases with high integration density, there is a high possibility that a problem of the soft error becomes more serious than ever.

A general soft error avoiding method is described in Patent Document 1 below. As depicted in FIG. 32, a capacitance C is added to a data holding node of a latch circuit constituted by inverters 3201 and 3202 thereby preventing data inversion due to charge generation by a radiation ray. Application of the above method to the latch circuit involves performance degradation in terms of a set up time, a delay time and the like.

Further, in Patent Document 2 below, there is described a memory cell having: first and second data lines; a bistable flip-flop circuit provided between the first and second data lines and including a first inverter having an input from the first data line and a second inverter having an output to the second data line; a first addressable transmission gate connected between the first inverter and the first data line; a second addressable transmission gate connected between the second inverter and the second data line; and a third addressable transmission gate connected between the output of the second inverter and the input of the first inverter to control feedback between the first and second inverters.

Further, in Patent Document 3 below, there is described a data holding circuit having: a data holding unit holding data to be outputted; a pull-up path taking in and holding inputted data as a pull-up control signal in synchronization with a clock and pulling up data held in the data holding unit when the pull-up signal has one of values; and a pull-down path taking in and holding the input data as a pull-down control signal in synchronization with the clock and pulling down data held in the data holding unit when the pull down control signal has the other of the values, wherein the pull-up path is configured so that an error in which the pull-up control signal changes from the other of the values to the one of the values does not occur, wherein the pull-down path is configured so that an error in which the pull-down control signal changes from the one of the values to the other of the values does not occur, wherein an error from the one of the values to the other of the values having occurred in the pull-up path does not change a value held in the pull-down path and the data holding unit, and wherein an error from the other of the values to the one of the values having occurred in the pull-down path does not change a value held in the pull-up path and the data holding unit.

Further, in Patent Document 4 below, there is described a semiconductor integrated circuit device multiplexed by connecting a first latch circuit and a second latch circuit in parallel, wherein the first latch circuit has an input terminal to make the first latch circuit operate independently of the second latch circuit.

Patent Document 1: Japanese Laid-open Patent Publication No. 2005-191454
Patent Document 2: Japanese Laid-open Patent Publication No. 2006-59523
Patent Document 3: Japanese Laid-open Patent Publication No. 2006-60847
Patent Document 4: Japanese Laid-open Patent Publication No. 06-237151

SUMMARY

A semiconductor device of the present embodiment includes: a latch circuit having a plurality of data holding nodes; a first capacitance element connected to the first data holding node included in the plurality of data holding nodes; and a first switch element provided between the first data holding node and the first capacitance element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2A and FIG. 2B are diagrams for explaining operational examples of the semiconductor device according to the first embodiment;

FIG. 3A and FIG. 3B are diagrams for explaining other operational examples of the semiconductor device according to the first embodiment;

FIG. 5A to FIG. 5F are circuit diagrams depicting configuration examples of a semiconductor device having a latch circuit according to a third embodiment;

FIG. 8A to FIG. 8E are circuit diagrams depicting configuration examples of a semiconductor device having a latch circuit according to a sixth embodiment;

FIG. 18A to FIG. 18F are circuit diagrams depicting configuration examples of a semiconductor device having a latch circuit according to a sixteenth embodiment;

FIG. 19A to FIG. 19F are circuit diagrams depicting configuration examples of a semiconductor device having a latch circuit according to a seventeenth embodiment;

FIG. 21A to FIG. 21F are circuit diagrams depicting configuration examples of a semiconductor device having a latch circuit according to a nineteenth embodiment;

FIG. 26A to FIG. 26C are circuit diagrams depicting configuration examples of a semiconductor device having a latch circuit according to a twenty-fourth embodiment;

FIG. 28A to FIG. 28C are circuit diagrams depicting configuration examples of a semiconductor device having a latch circuit according to a twenty-sixth embodiment;

FIG. 30A to FIG. 30C are circuit diagrams depicting configuration examples of a semiconductor device having a latch circuit according to a twenty-eighth embodiment;

DESCRIPTION OF EMBODIMENTS

Figure 1A:
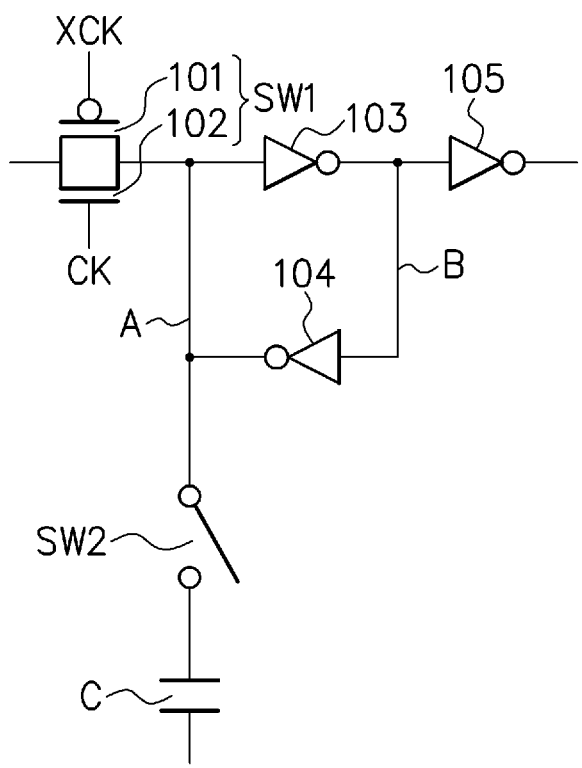
FIG. 1A to FIG. 1E are circuit diagrams depicting configuration examples of a semiconductor device having a latch circuit according to a first embodiment.

FIG. 1A is a circuit diagram depicting a configuration example of a semiconductor device having a latch circuit according to a first embodiment. Hereinafter, a MOS field-effect transistor is simply referred to as a transistor. A p-channel transistor 101 and an n-channel transistor 102 constitute a switch SW1. A gate of the p-channel transistor 101 is connected to a clock signal XCK, while a source and a drain thereof are connected to a data input terminal and an input terminal of an inverter 103. A gate of the n-channel transistor 102 is connected a clock signal CK, while a source and a drain thereof are connected to the data input terminal and the input terminal of the inverter 103. The clock signals CK and XCK are signals inverted to each other. An output terminal of the inverter 103 is connected to an input terminal of an inverter 105. An output terminal of the inverter 105 is connected to a data output terminal. The inverters 103 and 104 constitute a latch circuit. An input terminal of the inverter 104 is connected to the output terminal of the inverter 103, while an output terminal thereof is connected to the input terminal of the inverter 103. A data holding node A is an interconnection node of the input terminal of the inverter 103 and the output terminal of the inverter 104. A data holding node B is an interconnection node of the output terminal of the inverter 103 and the input terminal of the inverter 104. The data holding node A is connected to a capacitance C via a switch SW2.

Figure 1B:
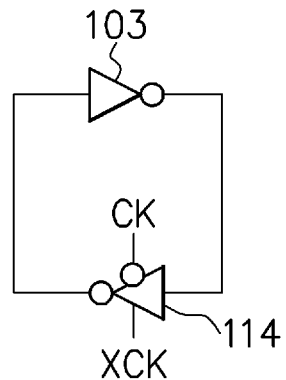

FIG. 1B is a circuit diagram depicting another configuration example of the latch circuit of FIG. 1A. A clock gate 114 can be used instead of the inverter 104 of FIG. 1A. An inverter 103 and the clock gate 114 constitute a latch circuit. In such a case, the switch SW2 is unnecessary. Details thereof will be described later with reference to FIG. 25A to FIG. 25C and the like.

Figure 1C:
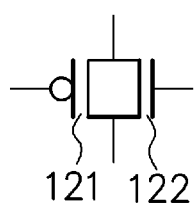

FIG. 1C is a circuit diagram depicting a configuration example of the switch SW2 of FIG. 1A. The switch SW2 is constituted by transistors 121 and 122. A source and a drain of the p-channel transistor 121 are connected to the data holding node A and the capacitance C. A drain and a source of the n-channel transistor 122 are connected to the data holding node A and the capacitance C. By controlling gate voltages of the transistors 121 and 122, an on/off operation of the switch SW2 can be controlled.

Figure 1D:
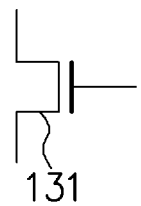

FIG. 1D is a circuit diagram depicting another configuration example of the switch SW2 of FIG. 1A. The switch SW2 is constituted by a transistor 131. A drain and a source of the re-channel transistor 131 are connected to a data holding node A and a capacitance C. By controlling a gate voltage of the transistor 131, an on/off operation of the switch SW2 can be controlled.

Figure 1E:
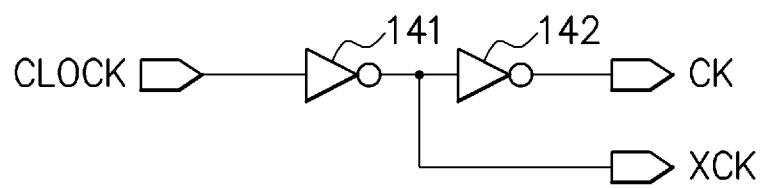

FIG. 1E is a circuit diagram depicting a configuration example of a clock generation circuit. The semiconductor device has the circuit of FIG. 1A and the clock generation circuit of FIG. 1E. The clock generation circuit has inverters 141 and 142. The inverter 141 outputs a clock signal XCK made by inverting a reference clock signal CLOCK. The inverter 142 outputs a clock signal CK made by inverting the clock signal XCK. The clock signals CK and XCK are signals inverted to each other.

FIG. 2A is a diagram depicting a configuration example of the semiconductor device made by constituting the switch SW2 by the switch of FIG. 1C in the semiconductor device of FIG. 1A. The source of the p-channel transistor 121 is connected to the data holding node A, the gate thereof is connected to the clock signal CK, and the drain thereof is connected to the capacitance C. The drain of the n-channel transistor 122 is connected to the data holding node A, the gate thereof is connected to the clock signal XCK, and the source thereof is connected to the capacitance C.

FIG. 2B is a flowchart depicting an operation of the semiconductor device of FIG. 2A. When the clock signal CK becomes a high level and the clock signal XCK becomes a low level, the transistors 101 and 102 are turned on, so that the switch SW1 is turned on. Then, during a data write time Tw, the data input terminal and the data holding node A are connected, so that data of the data holding node A becomes the same as data of the data input terminal.

In contrast, when the clock signal CK becomes a low level and the clock signal XCK becomes a high level, the transistors 101 and 102 are turned off, so that the switch SW1 is turned off. Then, during a data hold time Th, the data input terminal and the data holding node A are disconnected. The inverter 103 inverts data of the data holding node A and outputs the inverted data to the data holding node B. The inverter 104 inverts data of the data holding node B and outputs the inverted data to the data holding node A. The inverters 103 and 104 constitute a latch circuit, and the data of the data holding node A and data holding node B is held. The inverter 105 inverts the data of the data holding node B and outputs the inverted data to the data output terminal. During the time Th in which the clock signal CK is at a low level, the data of the data holding node A and the data holding node B is held even if the data of the data input terminal changes, since the switch SW1 is in an OFF state.

Here, during the data hold time Th, since the clock signal CK is at a low level and the clock signal XCK is at a high level, the switch SW2 is turned on. The capacitance C is connected to the data holding node A. Since the data of the data holding node A is stored in the capacitance C, the data of the data holding node A is stably held, so that a soft error of the data holding node A can be prevented.

During the data write time Tw, since the clock signal CK is at a high level and the clock signal XCK is at a low level, the switch SW2 is turned off. Thereby, the capacitance C is disconnected from the data holding node A, so that delay in data writing speed can be prevented. More specifically, it is possible to prevent performance degradation in terms of a set up time, delay time and the like.

FIG. 3A is a circuit diagram depicting another configuration example of the semiconductor device having the latch circuit according to the present embodiment. Hereinafter, a point of difference in FIG. 3A compared with FIG. 2A will be described. A clock signal HCK is inputted to a gate of a p-channel transistor 121, while a clock signal XHCK is inputted to a gate of an n-channel transistor 122. The clock signals HCK and XHCK are signals inverted to each other.

FIG. 3B is a flowchart depicting an operation of the semiconductor device of FIG. 3A. Clock signals CK and HCK are different signals. Hereinafter, a point of difference in FIG. 3B compared with FIG. 2B will be described.

During a time Ton in which the clock signal HCK is at a low level and the clock signal XHCK is at a high level, a switch SW2 is turned on and a capacitance C is connected to a data holding node A.

During a time Toff when the clock signal HCK is at a high level and the clock signal XHCK is at a low level, the switch SW2 is turned off and the capacitance C is disconnected from the data holding node A.

During a data write time Tw, the switch SW2 is in an OFF state in a time Ta being part of the data write time Tw. Further, during a data hold time Th, the switch SW2 is in an OFF state in a time Tb being part of the data hold time Th.

In principle, it suffices that the time Ta is longer than a set up time of a latch circuit. It suffices that the time Tb is shorter than the data hold time Th. If a set up time is measured in practice and the time Ta is determined in a range in which the set up time is not reduced, the set up time is not reduced, as a matter of course.

Figure 4A:
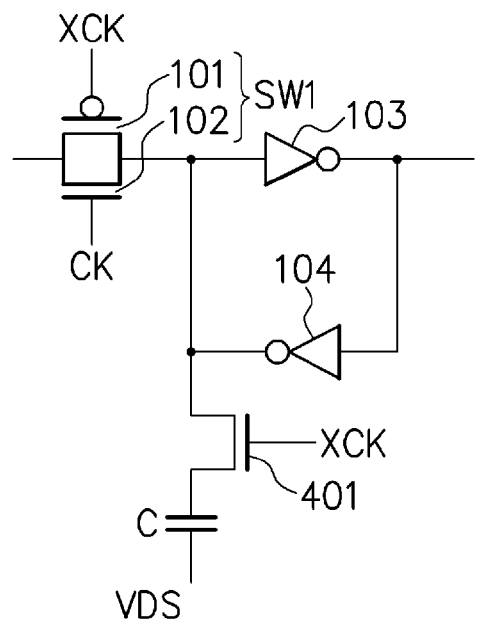
FIG. 4A to FIG. 4D are circuit diagrams depicting configuration examples of a semiconductor device having a latch circuit according to a second embodiment.

FIG. 4A is a circuit diagram depicting a configuration example of a semiconductor device having a latch circuit according to a second embodiment. Hereinafter, a point of difference in FIG. 4A compared with FIG. 1A will be described. An n-channel transistor 401 corresponds to the switch SW2. A drain of the n-channel transistor 401 is connected to an input terminal of an inverter 103, a gate thereof is connected to a clock signal XCK, and a source thereof is connected to a capacitance C. The capacitance C is connected between the transistor 401 and a node VDS. The node VDS is a node of a reference potential (ground potential) or a power supply voltage, and the same also applies to the followings.

Figure 4B:
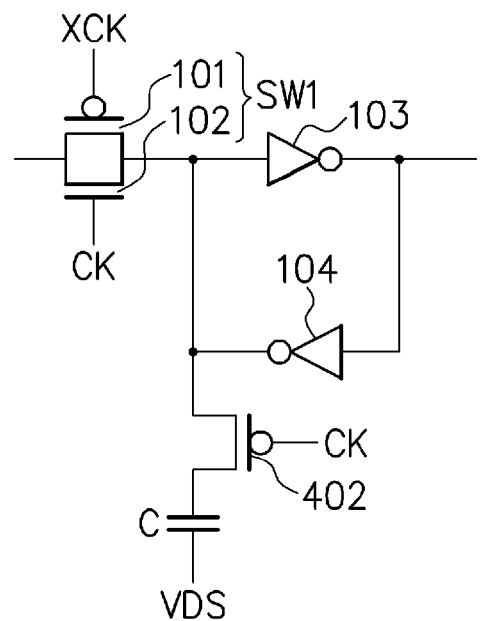

FIG. 4B is a circuit diagram depicting another configuration example of the semiconductor device having the latch circuit of the present embodiment. Hereinafter, a point of difference in FIG. 4B compared with FIG. 4A will be described. A p-channel transistor 402 is provided instead of the n-channel transistor 401. A source of the p-channel transistor 402 is connected to an input terminal of an inverter 103, a gate thereof is connected to a clock signal CK, and a drain thereof is connected to a capacitance C.

Figure 4C:
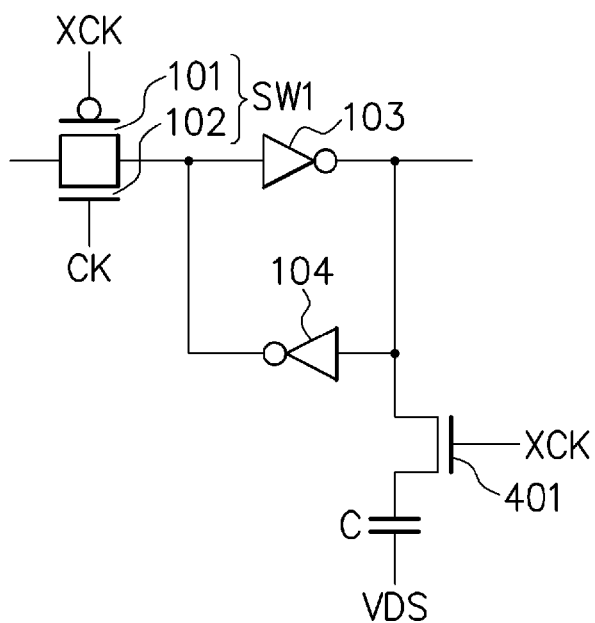

FIG. 4C is a circuit diagram depicting another configuration example of the semiconductor device having the latch circuit according to the present embodiment. Hereinafter, a point of difference in FIG. 4C compared with FIG. 4A will be described. A drain of an n-channel transistor 401 is connected to an output terminal of an inverter 103, not to an input terminal of the inverter 103. Thereby, a soft error of a data holding node B of the output terminal of the inverter 103 can be prevented.

Figure 4D:
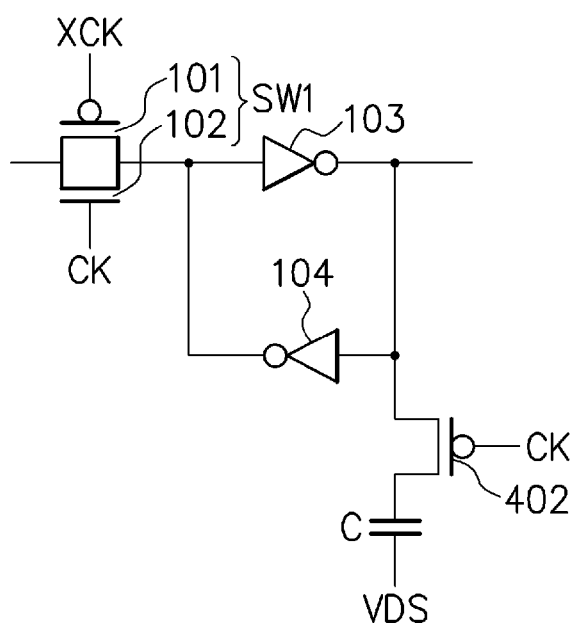

FIG. 4D is a circuit diagram depicting another configuration example of the semiconductor device having the latch circuit according to the present embodiment. Hereinafter, a point of difference in FIG. 4D compared with FIG. 4B will be described. A source of a p-channel transistor 402 is connected to an output terminal of an inverter 103, not to an input terminal of the inverter 103. Thereby, a soft error of a data holding node B of the output terminal of the inverter 103 can be prevented.

FIG. 5A is a circuit diagram depicting a configuration example of a semiconductor device having a latch circuit according to a third embodiment. Hereinafter, a point of difference in FIG. 5A compared with FIG. 2A will be described. A transistor 501, a transistor 502, and a capacitance C1 correspond to the transistor 122, the transistor 121, and the capacitance C of FIG. 2A, respectively. The capacitance C1 is connected to a node VDS.

FIG. 5B is a circuit diagram depicting another configuration example of the semiconductor device having the latch circuit according to the present embodiment. In FIG. 5B, a transistor 502 and a capacitance C2 are added compared with FIG. 4A. A transistor 501 and a capacitance C1 correspond to the transistor 401 and the capacitance C of FIG. 4A, respectively. A source of the p-channel transistor 502 is connected to an output terminal of an inverter 103, a gate thereof is connected to a clock signal CK, and a drain thereof is connected to a node VDS via the capacitance C2. Thereby, a soft error of an input terminal (data holding node A) and the output terminal (data holding node B) of the inverter 103 can be prevented.

FIG. 5C is a circuit diagram depicting another configuration example of the semiconductor device having the latch circuit according to the present embodiment. In FIG. 5C, transistors 501 and 502 are counterchanged compared with FIG. 5B. A drain of the n-channel transistor 501 is connected to an output terminal of an inverter 103, a gate thereof is connected to a clock signal XCK, and a source thereof is connected to a node VDS via a capacitance C2. A source of the p-channel transistor 502 is connected to an input terminal of the inverter 103, a gate thereof is connected to a clock signal CK, and a drain thereof is connected to a node VDS via a capacitance C1.

FIG. 5D is a circuit diagram depicting another configuration example of the semiconductor device having the latch circuit according to the present embodiment. Hereinafter, a point of difference in FIG. 5D compared with FIG. 5A will be described. A switch SW2 constituted by transistors 501 and 502 is connected between an output terminal of an inverter 103 and a capacitance C2. The capacitance C2 corresponds to the capacitance C1 of FIG. 5A.

FIG. 5E is a circuit diagram depicting another configuration example of the semiconductor device having the latch circuit according to the present embodiment. Hereinafter, a point of difference in FIG. 5E compared with FIG. 5B will be described. A transistor 503 is provided instead of the transistor 502 of FIG. 5B. A drain of the re-channel transistor 503 is connected to an output terminal of an inverter 103, a gate thereof is connected to a clock signal XCK, and a source thereof is connected to a node VDS via a capacitance C2.

FIG. 5F is a circuit diagram depicting another configuration example of the semiconductor device having the latch circuit according to the present embodiment. Hereinafter, a point of difference in FIG. 5F compared with FIG. 5C will be described. A transistor 504 is provided instead of the transistor 501 of FIG. 5C. A source of the p-channel transistor 504 is connected to an output terminal of an inverter 103, a gate thereof is connected to a clock signal CK, and a drain thereof is connected to a node VDS via a capacitance C2.

Figure 6A:
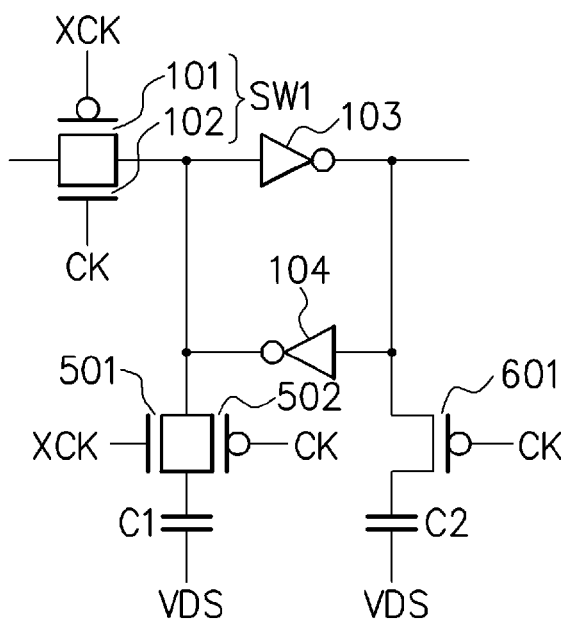
FIG. 6A to FIG. 6D are circuit diagrams depicting configuration examples of a semiconductor device having a latch circuit according to a fourth embodiment.

FIG. 6A is a circuit diagram depicting a configuration example of a semiconductor device having a latch circuit according to a fourth embodiment. In FIG. 6A, a transistor 601 and a capacitance C2 are added compared with FIG. 5A. A source of the p-channel transistor 601 is connected to an output terminal of an inverter 103, a gate thereof is connected to a clock signal CK, and a drain thereof is connected to a node VDS via the capacitance C2. A soft error of an input terminal and the output terminal of the inverter 103 can be prevented.

Figure 6B:
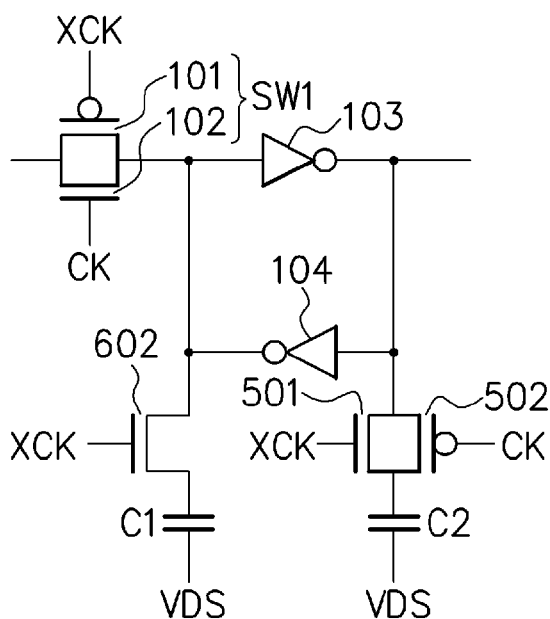

FIG. 6B is a circuit diagram depicting another configuration example of the semiconductor device having the latch circuit according to the present embodiment. In FIG. 6B, a transistor 602 and a capacitance C1 are added compared with FIG. 5D. A drain of the n-channel transistor 602 is connected to an input terminal of an inverter 103, a gate thereof is connected to a clock signal XCK, and a source thereof is connected to a node VDS via the capacitance C1.

Figure 6C:
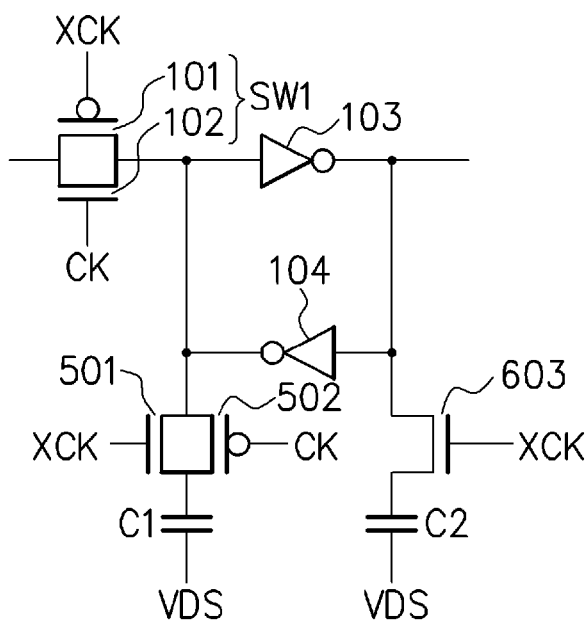

FIG. 6C is a circuit diagram depicting another configuration example of the semiconductor device having the latch circuit according to the present embodiment. In FIG. 6C, a transistor 603 is provided instead of the transistor 601 compared with FIG. 6A. A drain of the n-channel transistor 603 is connected to an output terminal of an inverter 103, a gate thereof is connected to a clock signal XCK, and a source thereof is connected to a node VDS via a capacitance C2.

Figure 6D:
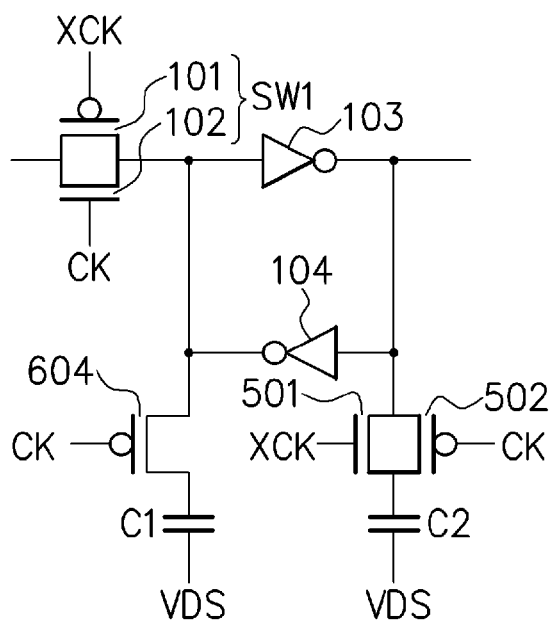

FIG. 6D is a circuit diagram depicting another configuration example of the semiconductor device having the latch circuit according to the present embodiment. In FIG. 6D, a transistor 604 is provided instead of the transistor 602 compared with FIG. 6B. A source of the p-channel transistor 604 is connected to an input terminal of an inverter 103, a gate thereof is connected to a clock signal CK, and a drain thereof is connected to a node VDS via a capacitance C1.

Figure 7A:
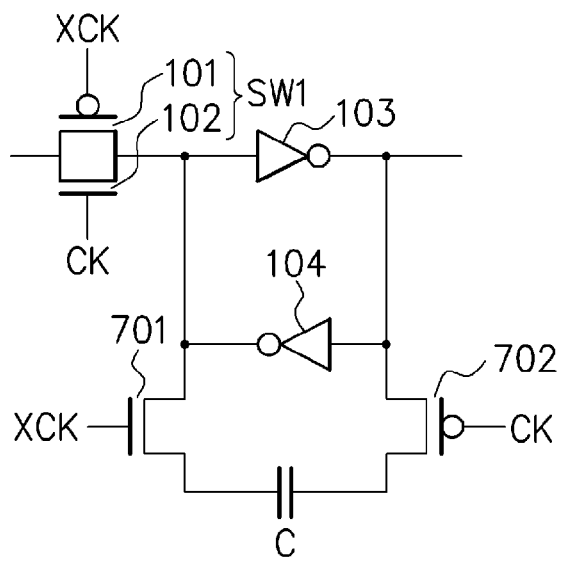
FIG. 7A to FIG. 7D are circuit diagrams depicting configuration examples of a semiconductor device having a latch circuit according to a fifth embodiment.

FIG. 7A is a circuit diagram depicting a configuration example of a semiconductor device having a latch circuit according to a fifth embodiment. Hereinafter, a point of difference in FIG. 7A compared with FIG. 5B will be described. Transistors 701 and 702 correspond to the transistors 501 and 502 of FIG. 5B, respectively. A capacitance C is connected between a source of the n-channel transistor 701 and a drain of the p-channel transistor 702. Since the capacitance C is a capacitance used as both the capacitances C1 and C2 of FIG. 5B, an area can be made small.

Figure 7B:
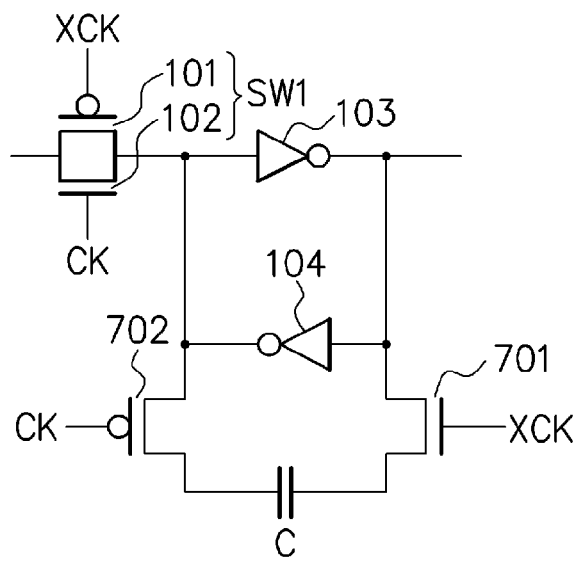

FIG. 7B is a circuit diagram depicting another configuration example of the semiconductor device having the latch circuit according to the present embodiment. Hereinafter, a point of difference in FIG. 7B compared with FIG. 5C will be described. Transistors 701 and 702 correspond to the transistors 501 and 502 of FIG. 5C, respectively. A capacitance C is connected between a source of the re-channel transistor 701 and a drain of the p-channel transistor 702.

Figure 7C:
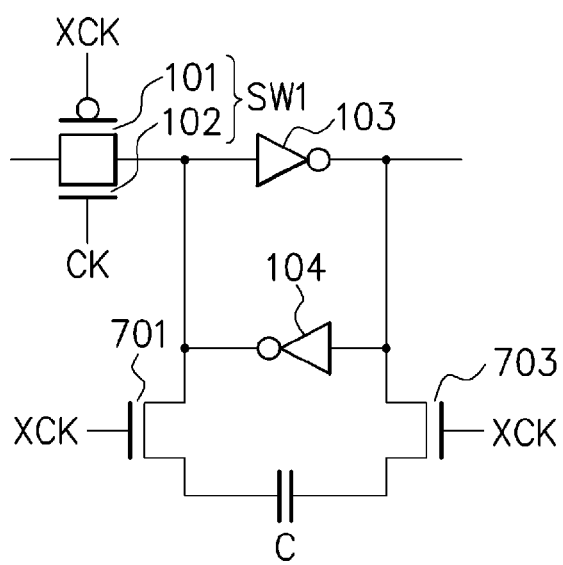

FIG. 7C is a circuit diagram depicting another configuration example of the semiconductor device having the latch circuit according to the present embodiment. Hereinafter, a point of difference in FIG. 7C compared with FIG. 5E will be described. Transistors 701 and 703 correspond to the transistors 501 and 503 of FIG. 5E, respectively. A capacitance C is connected between sources of the re-channel transistors 701 and 703.

Figure 7D:
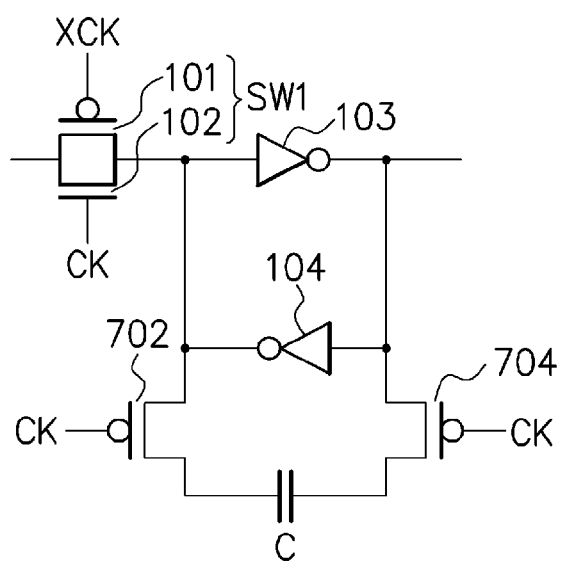

FIG. 7D is a circuit diagram depicting another configuration example of the semiconductor device having the latch circuit according to the present embodiment. Hereinafter, a point of difference in FIG. 7D compared with FIG. 5F will be described. Transistors 702 and 704 correspond to the transistors 502 and 504 of FIG. 5F, respectively. A capacitance C is connected to drains of the p-channel transistors 702 and 704.

FIG. 8A is a circuit diagram depicting a configuration example of a semiconductor device having a latch circuit according to a sixth embodiment. In FIG. 8A, transistors 801 and 802 are provided instead of the transistor 702 compared with FIG. 7A. A drain of the n-channel transistor 801 is connected to an output terminal of an inverter 103, a gate thereof is connected to a clock signal XCK, and a source thereof is connected to a capacitance C. A source of the p-channel transistor 802 is connected to the output terminal of the inverter 103, a gate thereof is connected to a clock signal CK, and a drain thereof is connected to the capacitance C. By sharing the capacitance C, an area can be made small.

FIG. 8B is a circuit diagram depicting another configuration example of the semiconductor device having the latch circuit according to the present embodiment. In FIG. 8B, transistors 801 and 802 are provided instead of the transistor 702 compared with FIG. 7B. A drain of the n-channel transistor 801 is connected to an input terminal of an inverter 103, a gate thereof is connected to a clock signal XCK, and a source thereof is connected to a capacitance C. A source of the p-channel transistor 802 is connected to the input terminal of the inverter 103, a gate thereof is connected to a clock signal CK, and a drain thereof is connected to the capacitance C.

FIG. 8C is a circuit diagram depicting another configuration example of the semiconductor device having the latch circuit according to the present embodiment. In FIG. 8C, transistors 801 and 802 are provided instead of the transistor 701 compared with FIG. 7B. A drain of the n-channel transistor 801 is connected to an output terminal of an inverter 103, a gate thereof is connected to a clock signal XCK, and a source thereof is connected to a capacitance C. A source of the p-channel transistor 802 is connected to the output terminal of the inverter 103, a gate thereof is connected to a clock signal CK, and a drain thereof is connected to the capacitance C.

FIG. 8D is a circuit diagram depicting another configuration example of the semiconductor device having the latch circuit according to the present embodiment. In FIG. 8D, transistors 801 and 802 are provided instead of the transistor 701 compared with FIG. 7A. A drain of the n-channel transistor 801 is connected to an input terminal of an inverter 103, a gate thereof is connected to a clock signal XCK, and a source thereof is connected to a capacitance C. A source of the p-channel transistor 802 is connected to the input terminal of the inverter 103, a gate thereof is connected to a clock signal CK, and a drain thereof is connected to the capacitance C.

FIG. 8E is a circuit diagram depicting another configuration example of the semiconductor device having the latch circuit according to the present embodiment. In FIG. 8E, transistors 803 and 804 are provided instead of the transistor 701 compared with FIG. 8B. A drain of the n-channel transistor 803 is connected to an output terminal of an inverter 103, a gate thereof is connected to a clock signal XCK, and a source thereof is connected to a capacitance C. A source of the p-channel transistor 804 is connected to the output terminal of the inverter 103, a gate thereof is connected to a clock signal CK, and a drain thereof is connected to the capacitance C.

Figure 9A:
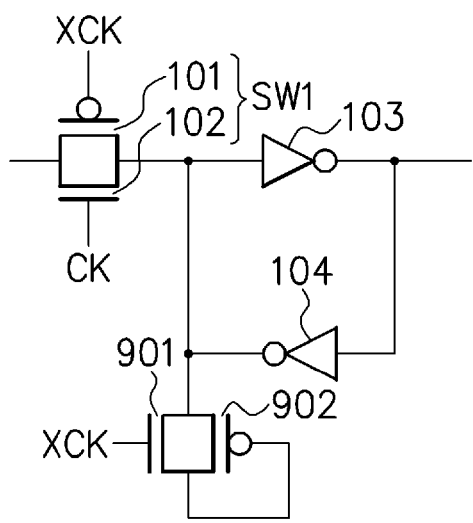
FIG. 9A to FIG. 9D are circuit diagrams depicting configuration examples of a semiconductor device having a latch circuit according to a seventh embodiment.

FIG. 9A is a circuit diagram depicting a configuration example of a semiconductor device having a latch circuit according to a seventh embodiment. In FIG. 9A, transistors 901 and 902 are provided instead of the transistor 401 and the capacitance C compared with FIG. 4A. A drain of the n-channel transistor 901 is connected to an input terminal of an inverter 103, a gate thereof is connected to a clock signal XCK, and a source thereof is connected to a gate of the p-channel transistor 902. A source of the p-channel transistor 902 is connected to the input terminal of the inverter 103, and the gate and a drain thereof are connected to each other. The transistors 901 and 902 correspond to the switch SW2 of FIG. 1A, while a gate capacitance of the transistor 902 corresponds to the capacitance C of FIG. 1A. Thereby, a circuit area can be made small.

Figure 9B:
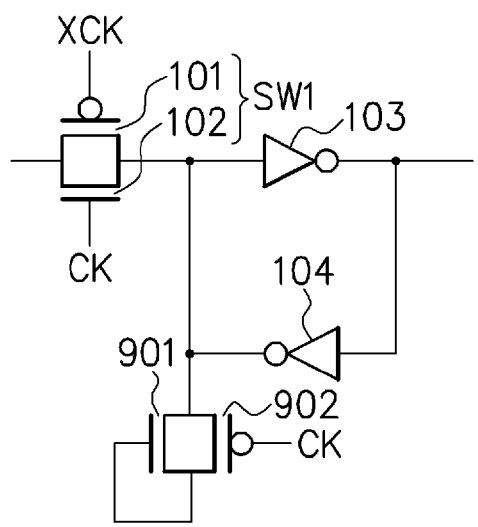

FIG. 9B is a circuit diagram depicting another configuration example of the semiconductor device having the latch circuit according to the present embodiment. Hereinafter, a point of difference in FIG. 9B compared with FIG. 9A will be described. A gate and a source of an n-channel transistor 901 are connected to each other. A gate of a p-channel transistor 902 is connected to a clock signal CK, and a drain thereof is connected to the gate of the n-channel transistor 901.

Figure 9C:
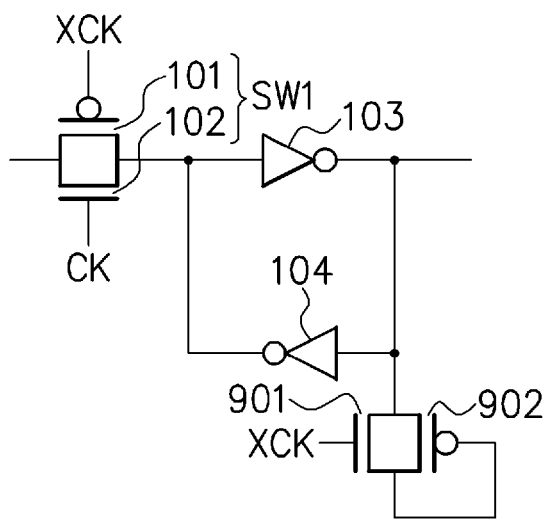

FIG. 9C is a circuit diagram depicting another configuration example of the semiconductor device having the latch circuit according to the present embodiment. Hereinafter, a point of difference in FIG. 9C compared with FIG. 9A will be described. A drain of an n-channel transistor 901 and a source of a p-channel transistor 902 are connected to an output terminal of an inverter 103.

Figure 9D:
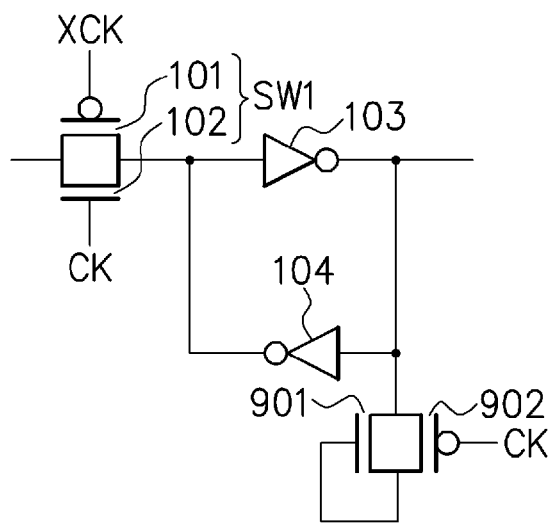

FIG. 9D is a circuit diagram depicting another configuration example of the semiconductor device having the latch circuit according to the present embodiment. Hereinafter, a point of difference in FIG. 9D compared with FIG. 9B will be described. A drain of an n-channel transistor 901 and a source of a p-channel transistor 902 are connected to an output terminal of an inverter 103.

Figure 10A:
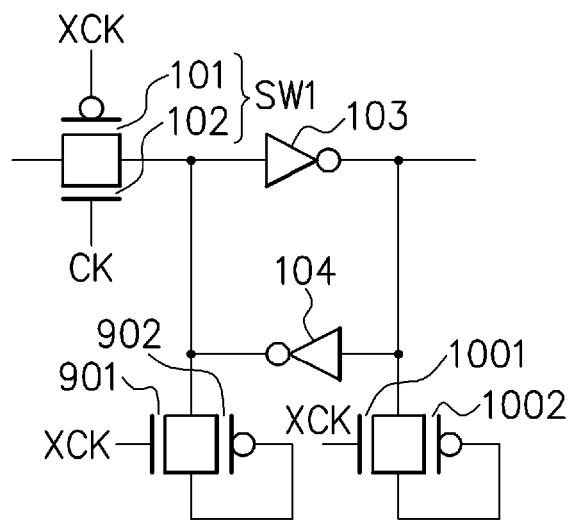
FIG. 10A to FIG. 10D are circuit diagrams depicting configuration examples of a semiconductor device having a latch circuit according to an eighth embodiment.

FIG. 10A is a circuit diagram depicting a configuration example of a semiconductor device having a latch circuit according to an eighth embodiment. In FIG. 10A, transistors 1001 and 1002 are added compared with FIG. 9A. A drain of the re-channel transistor 1001 is connected to an output terminal of an inverter 103, a gate thereof is connected to a clock signal XCK, and a source thereof is connected to a gate of the p-channel transistor 1002. A source of the p-channel transistor 1002 is connected to the output terminal of the inverter 103, and the gate and a drain thereof are connected to each other. A soft error of an input terminal and the output terminal of the inverter 103 can be prevented.

Figure 10B:
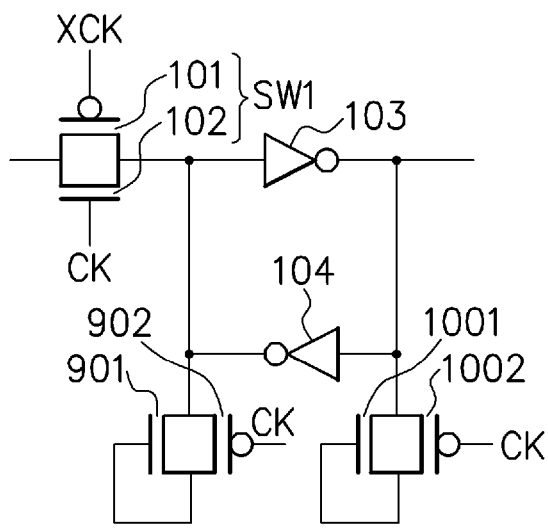

FIG. 10B is a circuit diagram depicting another configuration example of the semiconductor device having the latch circuit according to the present embodiment. In FIG. 10B, transistors 1001 and 1002 are added compared with FIG. 9B. A drain of the n-channel transistor 1001 is connected to an output terminal of an inverter 103, and a gate and a source thereof are connected to each other. A source of the p-channel transistor 1002 is connected to the output terminal of the inverter 103, a gate thereof is connected to a clock signal CK, and a drain thereof is connected to the gate of the n-channel transistor 1001.

Figure 10C:
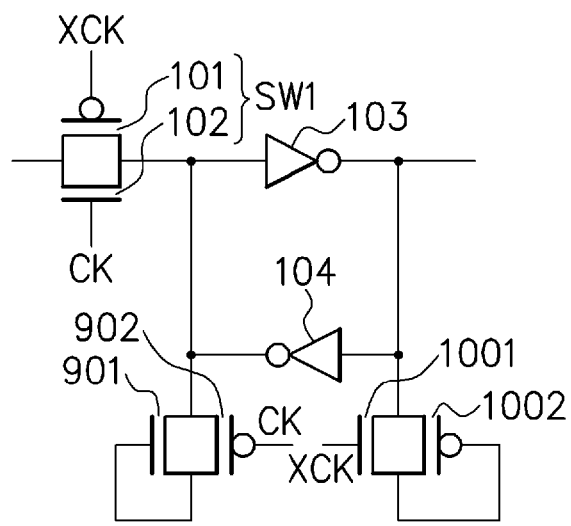

FIG. 10C is a circuit diagram depicting another configuration example of the semiconductor device having the latch circuit according to the present embodiment. Hereinafter, a point of difference in FIG. 10C compared with FIG. 10B will be described. A gate of an n-channel transistor 1001 is connected to a clock signal XCK, and a source thereof is connected to a gate of a p-channel transistor 1002. The gate and a drain of the p-channel transistor 1002 are connected to each other.

Figure 10D:
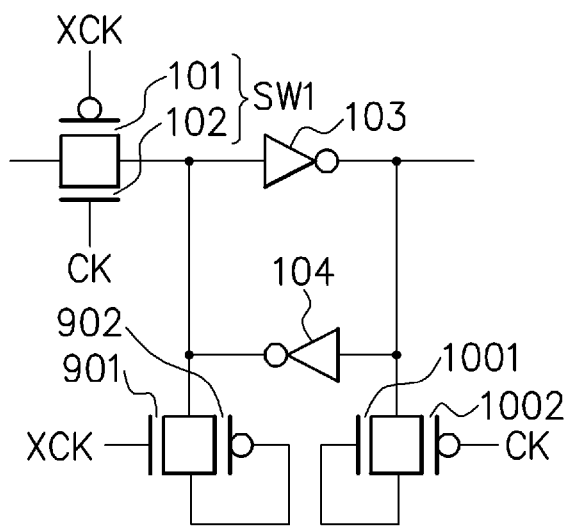

FIG. 10D is a circuit diagram depicting another configuration example of the semiconductor device having the latch circuit according to the present embodiment. Hereinafter, a point of difference in FIG. 10D compared with FIG. 10A will be described. A gate and a source of an n-channel transistor 1001 are connected to each other. A gate of a p-channel transistor 1002 is connected to a clock signal CK, and a drain thereof is connected to the gate of the n-channel transistor 1001.

Figure 11A:
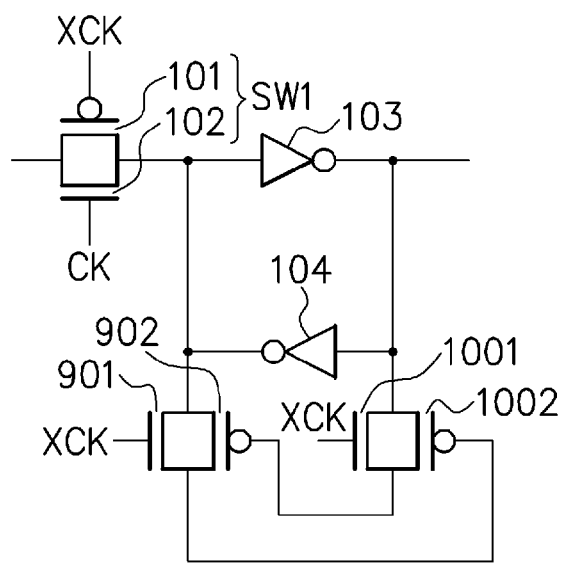
FIG. 11A to FIG. 11D are circuit diagrams depicting configuration examples of a semiconductor device having a latch circuit according to a ninth embodiment.

FIG. 11A is a circuit diagram depicting a configuration example of a semiconductor device having a latch circuit according to a ninth embodiment. Hereinafter, a point of difference in FIG. 11A compared with FIG. 10 A will be described. A gate of a p-channel transistor 902 is connected to a source of an n-channel transistor 1001 and a drain of a p-channel transistor 1002. A gate of the p-channel transistor 1002 is connected to a source of the n-channel transistor 901 and a drain of a p-channel transistor 902. An input terminal of an inverter 103 is connected to a gate capacitance of the transistor 1002 via a switch constituted by the transistors 901 and 902. Further, an output terminal of the inverter 103 is connected to a gate capacitance of the transistor 902 via a switch constituted by the transistors 1001 and 1002.

Figure 11B:
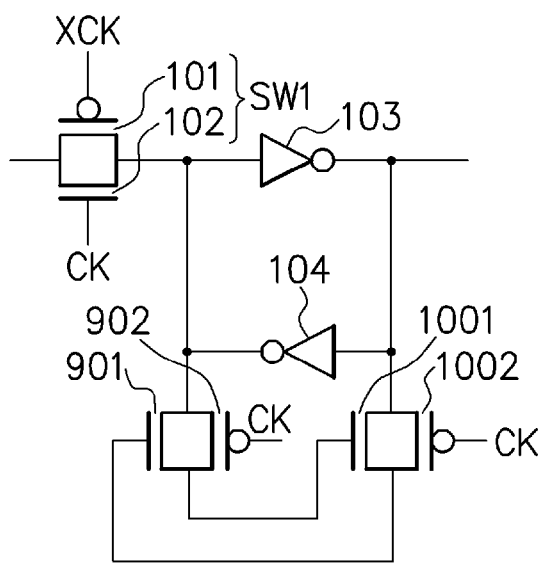

FIG. 11B is a circuit diagram depicting another configuration example of the semiconductor device having the latch circuit according to the present embodiment. Hereinafter, a point of difference in FIG. 11B compared with FIG. 10B will be described. A gate of an n-channel transistor 901 is connected to a source of an n-channel transistor 1001 and a drain of a p-channel transistor 1002. A gate of the n-channel transistor 1001 is connected to a source of the n-channel transistor 901 and a drain of a p-channel transistor 902.

Figure 11C:
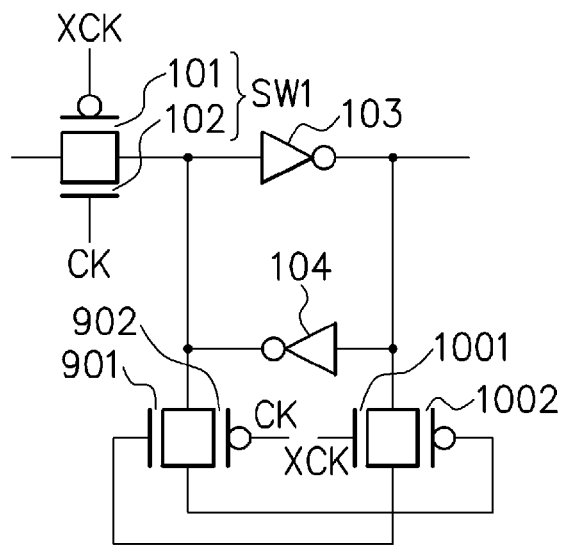

FIG. 11C is a circuit diagram depicting another configuration example of the semiconductor device having the latch circuit according to the present embodiment. Hereinafter, a point of difference in FIG. 11C compared with FIG. 10C will be described. A gate of an n-channel transistor 901 is connected to a source of an n-channel transistor 1001 and a drain of a p-channel transistor 1002. A gate of the p-channel 1002 transistor is connected to a source of the n-channel transistor 901 and a drain of a p-channel transistor 902.

Figure 11D:
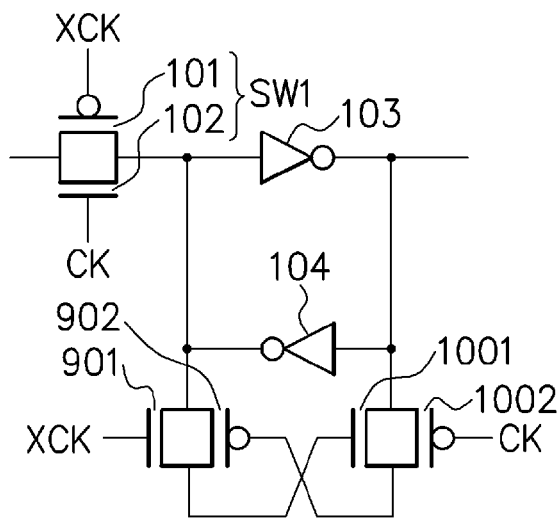

FIG. 11D is a circuit diagram depicting another configuration example of the semiconductor device having the latch circuit according to the present embodiment. Hereinafter, a point of difference in FIG. 11D compared with FIG. 10D will be described. A gate of a p-channel transistor 902 is connected to a source of an n-channel transistor 1001 and a drain of a p-channel transistor 1002. A gate of the n-channel transistor 1001 is connected to a source of an n-channel transistor 901 and a drain of the p-channel transistor 902.

Figure 12A:
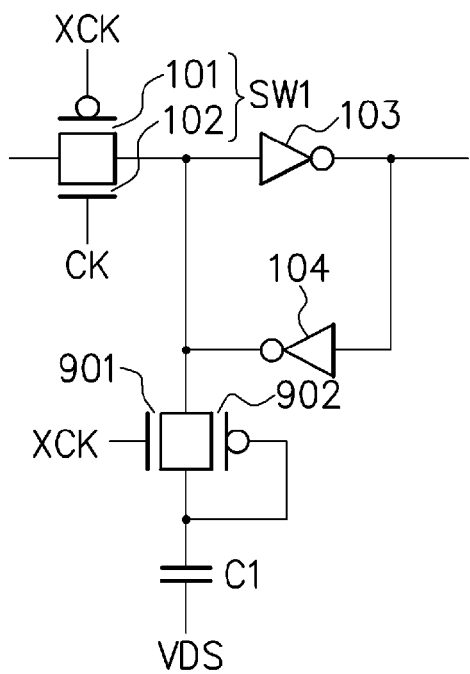
FIG. 12A to FIG. 12D are circuit diagrams depicting configuration examples of a semiconductor device having a latch circuit according to a tenth embodiment.

FIG. 12A is a circuit diagram depicting a configuration example of a semiconductor device having a latch circuit according to a tenth embodiment. In FIG. 12A, a capacitance C1 is added compared with FIG. 9A. The capacitance C1 is connected between a gate of a p-channel transistor 902 and a node VDS. By adding the capacitance C1 to a gate capacitance of the transistor 902, a soft error can be prevented more effectively.

Figure 12B:
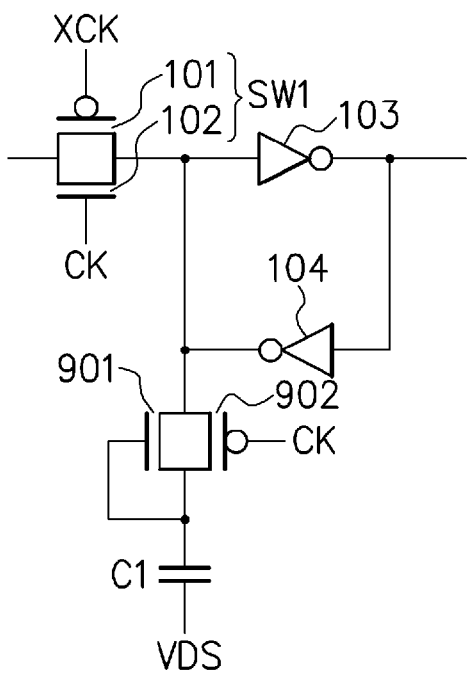

FIG. 12B is a circuit diagram depicting another configuration example of the semiconductor device having the latch circuit according to the present embodiment. In FIG. 12B, a capacitance C1 is added compared with FIG. 9B. The capacitance C1 is connected between a gate of an n-channel transistor 901 and a node VDS.

Figure 12C:
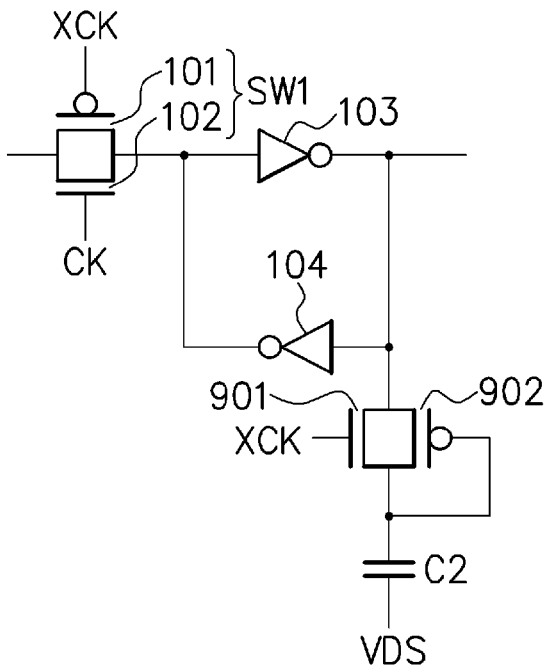

FIG. 12C is a circuit diagram depicting another configuration example of the semiconductor device having the latch circuit according to the present embodiment. In FIG. 12C, a capacitance C2 is added compared with FIG. 9C. The capacitance C2 is connected between a gate of a p-channel transistor 902 and a node VDS.

Figure 12D:
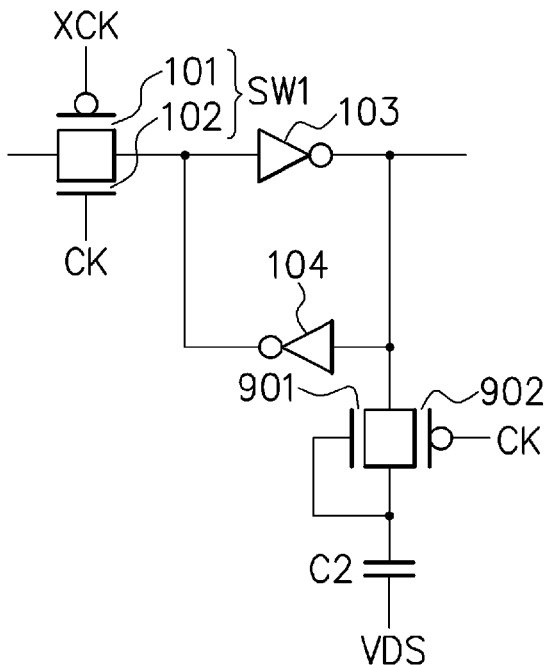

FIG. 12D is a circuit diagram depicting another configuration example of the semiconductor device having the latch circuit according to the present embodiment. In FIG. 12D, a capacitance C2 is added compared with FIG. 9D. The capacitance C2 is connected between a gate of an n-channel transistor 901 and a node VDS.

Figure 13A:
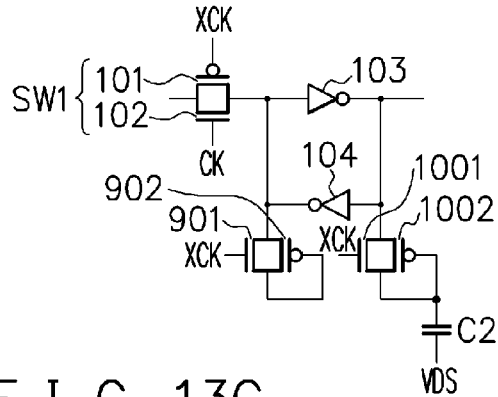
FIG. 13A to FIG. 13H are circuit diagrams depicting configuration examples of a semiconductor device having a latch circuit according to an eleventh embodiment.

FIG. 13A is a circuit diagram depicting a configuration example of a semiconductor device having a latch circuit according to an eleventh embodiment. In FIG. 13A, a capacitance C2 is added compared with FIG. 10A. The capacitance C2 is connected between a gate of a p-channel transistor 1002 and a node VDS. By adding the capacitance C2 to a gate capacitance of the transistor 1002, a soft error can be prevented more effectively.

Figure 13B:
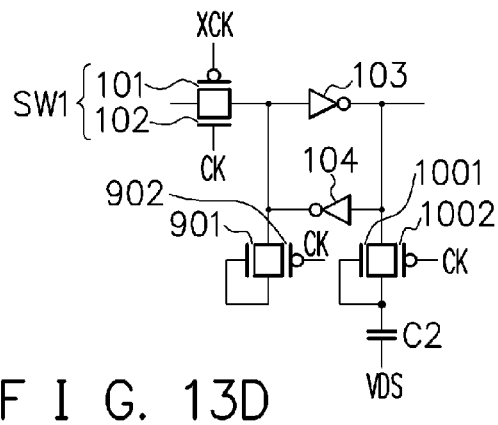

FIG. 13B is a circuit diagram depicting another configuration example of the semiconductor device having the latch circuit according to the present embodiment. In FIG. 13B, a capacitance C2 is added compared with FIG. 10B. The capacitance C2 is connected between a gate of an n-channel transistor 1001 and a node VDS.

Figure 13C:
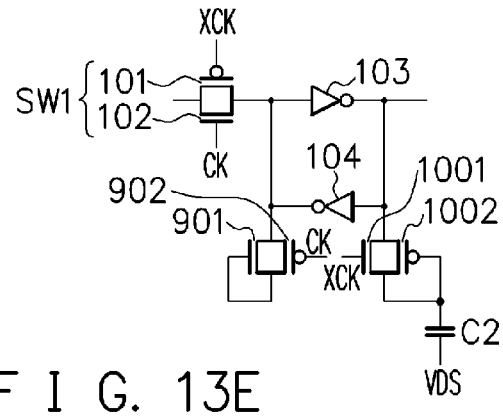

FIG. 13C is a circuit diagram depicting another configuration example of the semiconductor device having the latch circuit according to the present embodiment. In FIG. 13C, a capacitance C2 is added compared with FIG. 10C. The capacitance C2 is connected between a gate of a p-channel transistor 1002 and a node VDS.

Figure 13D:
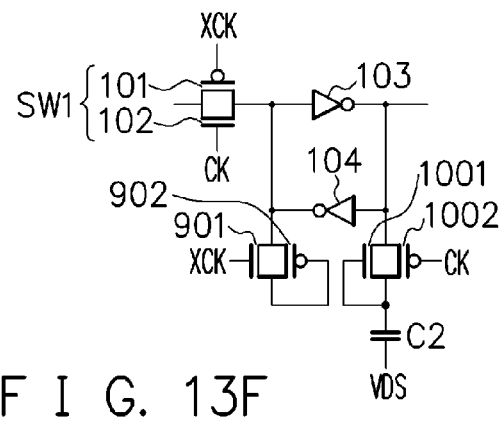

FIG. 13D is a circuit diagram depicting another configuration example of the semiconductor device having the latch circuit according to the present embodiment. In FIG. 13D, a capacitance C2 is added compared with FIG. 10D. The capacitance C2 is connected between a gate of an n-channel transistor 1001 and a node VDS.

Figure 13E:
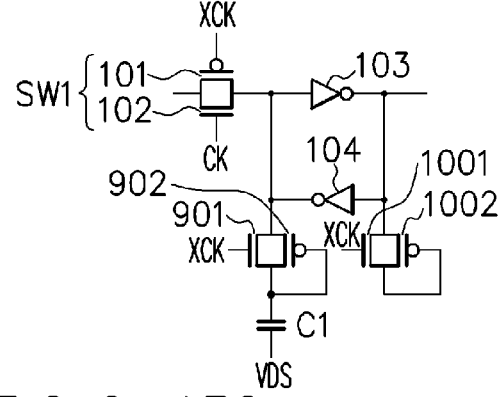

FIG. 13E is a circuit diagram depicting another configuration example of the semiconductor device having the latch circuit according to the present embodiment. In FIG. 13E, a capacitance C1 is added compared with FIG. 10A. The capacitance C1 is connected between a gate of a p-channel transistor 902 and a node VDS.

Figure 13F:
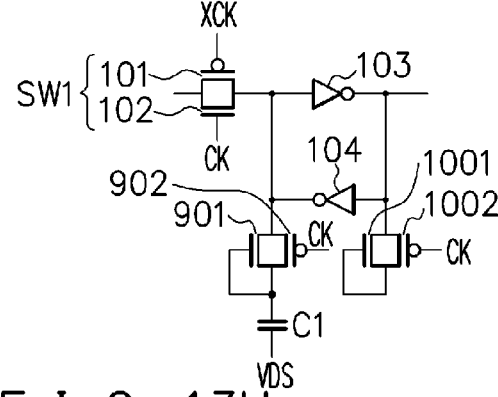

FIG. 13F is a circuit diagram depicting another configuration example of the semiconductor device having the latch circuit according to the present embodiment. In FIG. 13F, a capacitance C1 is added compared with FIG. 10B. The capacitance C1 is connected between gate of an n-channel transistor 901 and a node VDS.

Figure 13G:
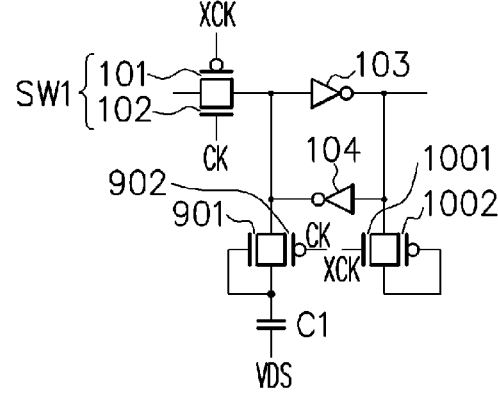

FIG. 13G is a circuit diagram depicting another configuration example of the semiconductor device having the latch circuit according to the present embodiment. In FIG. 13G, a capacitance C1 is added compared with FIG. 10C. The capacitance C1 is connected between a gate of an n-channel transistor 901 and a node VDS.

Figure 13H:
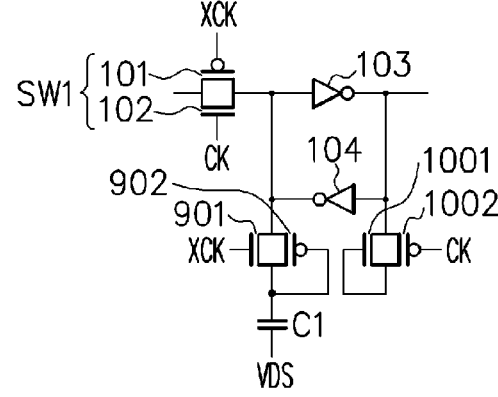

FIG. 13H is a circuit diagram depicting another configuration example of the semiconductor device having the latch circuit according to the present embodiment. In FIG. 13H, a capacitance C1 is added compared with FIG. 10D. The capacitance C1 is connected between a gate of a p-channel transistor 902 and a node VDS.

Figure 14A:
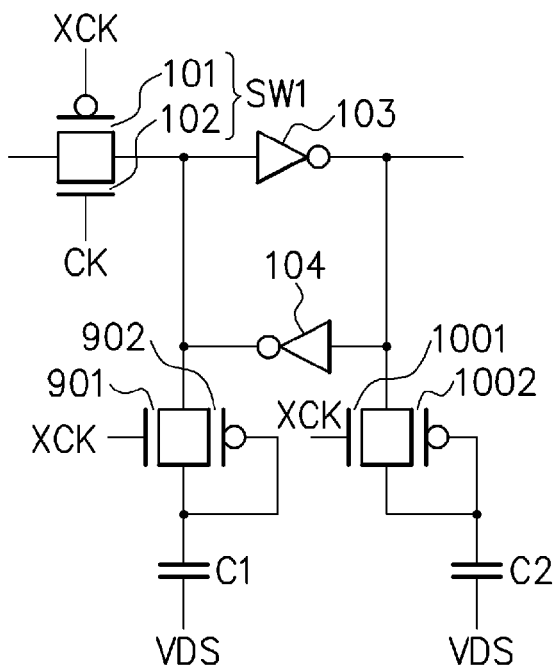
FIG. 14A to FIG. 14D are circuit diagrams depicting configuration examples of a semiconductor device having a latch circuit according to a twelfth embodiment.

FIG. 14A is a circuit diagram depicting a configuration example of a semiconductor device having a latch circuit according to a twelfth embodiment. In FIG. 14A, a capacitance C1 is added compared with FIG. 13A. The capacitance C1 is connected between a gate of a p-channel transistor 902 and a node VDS. By adding the capacitance C1 to a gate capacitance of the transistor 902, a soft error can be prevented more effectively.

Figure 14B:
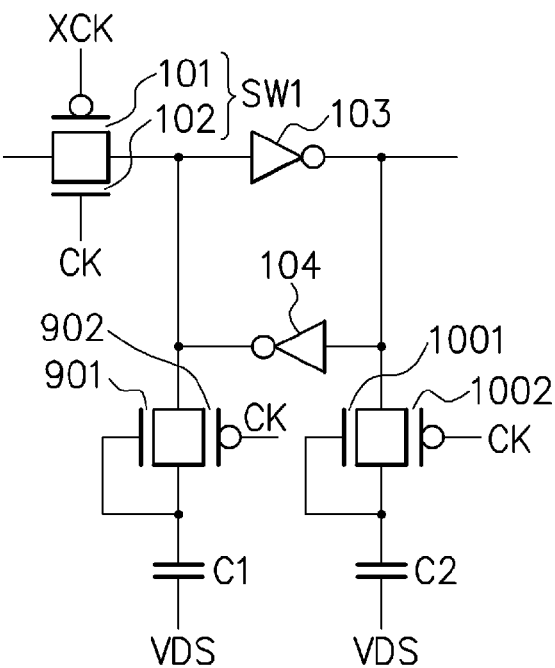

FIG. 14B is a circuit diagram depicting another configuration example of the semiconductor device having the latch circuit according to the present embodiment. In FIG. 14B, a capacitance C1 is added compared with FIG. 13B. The capacitance C1 is connected between a gate of an n-channel transistor 901 and a node VDS.

Figure 14C:
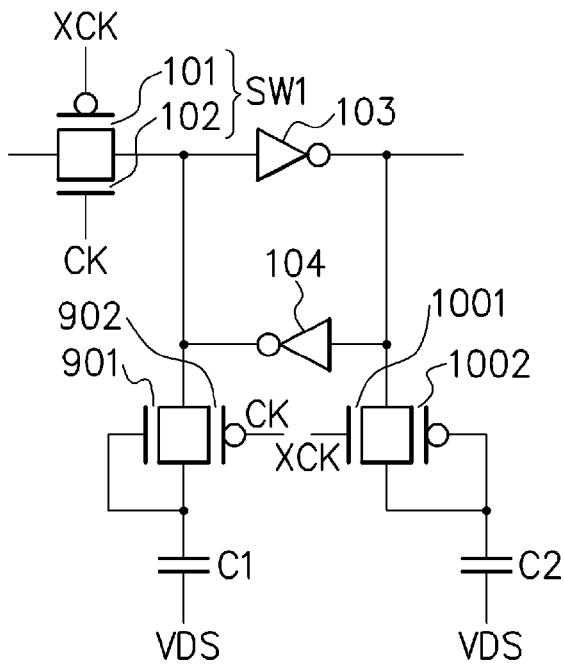

FIG. 14C is a circuit diagram depicting another configuration example of the semiconductor device having the latch circuit according to the present embodiment. In FIG. 14C, a capacitance C1 is added compared with FIG. 13C. The capacitance C1 is connected between a gate of an n-channel transistor 901 and a node VDS.

Figure 14D:
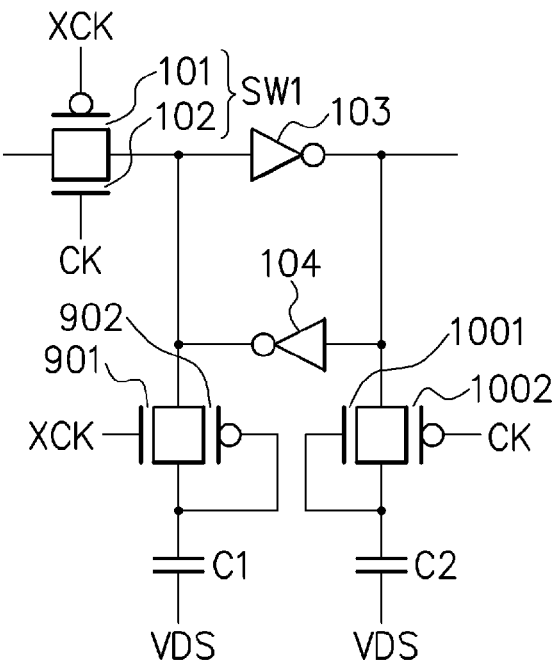

FIG. 14D is a circuit diagram depicting another configuration example of the semiconductor device having the latch circuit according to the present embodiment. In FIG. 14D, a capacitance C1 is added compared with FIG. 13D. The capacitance C1 is connected between a gate of a p-channel transistor 902 and a node VDS.

Figure 15A:
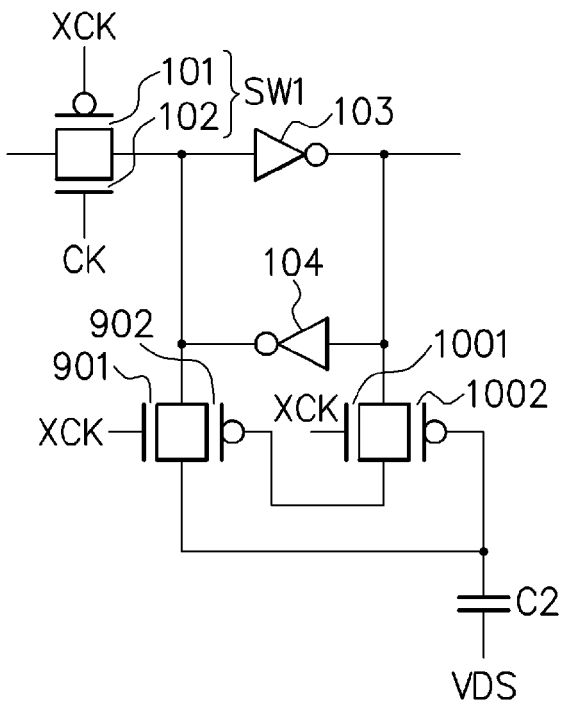
FIG. 15A to FIG. 15D are circuit diagrams depicting configuration examples of a semiconductor device having a latch circuit according to a thirteenth embodiment.

FIG. 15A is a circuit diagram depicting a configuration example of a semiconductor device having a latch circuit according to a thirteenth embodiment. In FIG. 15A, a capacitance C2 is added compared with FIG. 11A. The capacitance C2 is connected between a gate of a p-channel transistor 1002 and a node VDS. By adding the capacitance C2 to a gate capacitance of the transistor 1002, a soft error can be prevented more effectively.

Figure 15B:
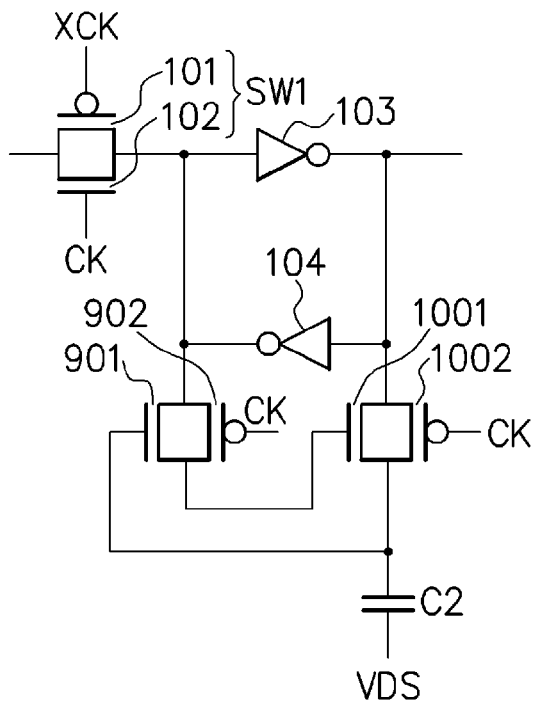

FIG. 15B is a circuit diagram depicting another configuration example of the semiconductor device having the latch circuit according to the present embodiment. In FIG. 15B, a capacitance C2 is added compared with FIG. 11B. The capacitance C2 is connected between a gate of an n-channel transistor 901 and a node VDS.

Figure 15C:
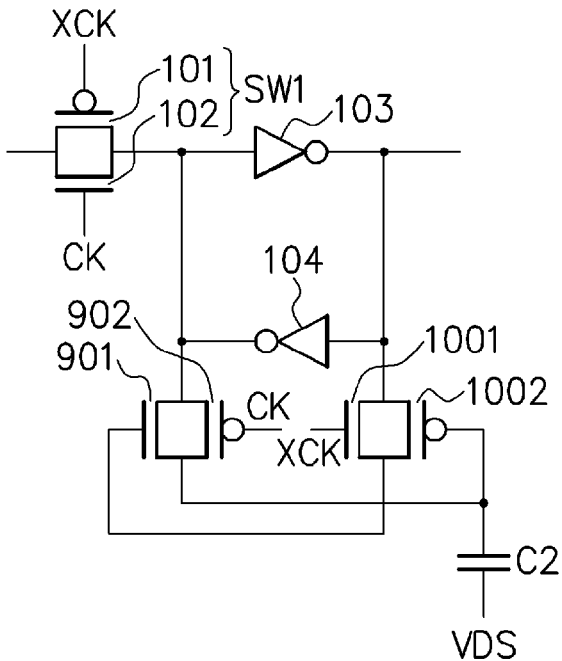

FIG. 15C is a circuit diagram depicting another configuration example of the semiconductor device having the latch circuit according to the present embodiment. In FIG. 15C, a capacitance C2 is added compared with FIG. 11C. The capacitance C2 is connected between a gate of a p-channel transistor 1002 and a node VDS.

Figure 15D:
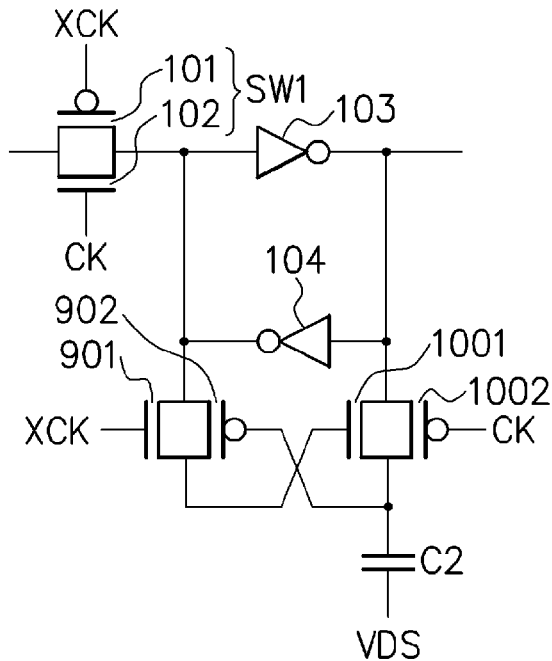

FIG. 15D is a circuit diagram depicting another configuration example of the semiconductor device having the latch circuit according to the present embodiment. In FIG. 15D, a capacitance C2 is added compared with FIG. 11D. The capacitance C2 is connected between a gate of a p-channel transistor 902 and a node VDS.

Figure 16A:
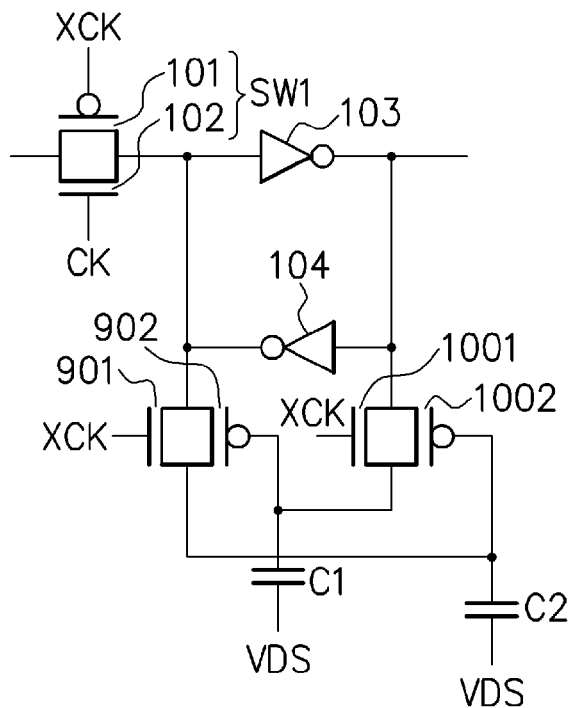
FIG. 16A to FIG. 16D are circuit diagrams depicting configuration examples of a semiconductor device having a latch circuit according to a fourteenth embodiment.

FIG. 16A is a circuit diagram depicting a configuration example of a semiconductor device having a latch circuit according to fourteenth embodiment. In FIG. 16A, a capacitance C1 is added compared with FIG. 15A. The capacitance C1 is connected between a gate of a p-channel transistor 902 and a node VDS. By adding the capacitance C1 to a gate capacitance of the transistor 902, a soft error can be prevented more effectively.

Figure 16B:
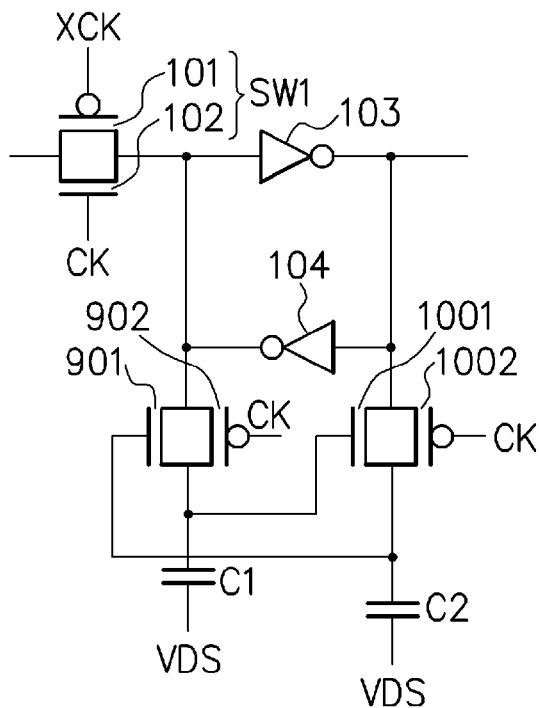

FIG. 16B is a circuit diagram depicting another configuration example of the semiconductor device having the latch circuit according to the present embodiment. In FIG. 16B, a capacitance C1 is added compared with FIG. 15B. The capacitance C1 is connected between a gate of an n-channel transistor 1001 and a node VDS.

Figure 16C:
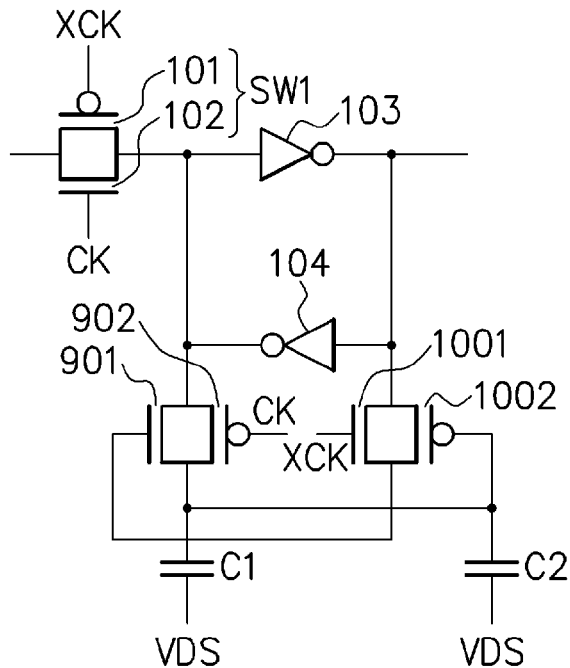

FIG. 16C is a circuit diagram depicting another configuration example of the semiconductor device having the latch circuit according to the present embodiment. In FIG. 16C, a capacitance C1 is added compared with FIG. 15C. The capacitance C1 is connected between a gate of a p-channel transistor 1002 and a node VDS.

Figure 16D:
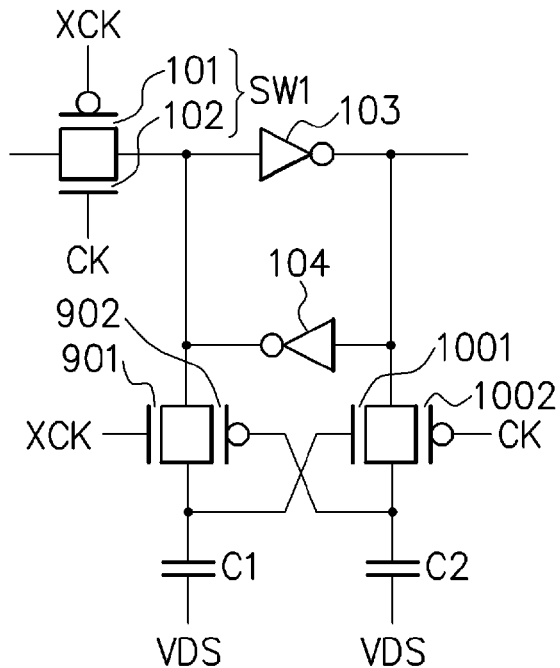

FIG. 16D is a circuit diagram depicting another configuration example of the semiconductor device having the latch circuit according to the present embodiment. In FIG. 16D, a capacitance C1 is added compared with FIG. 15D. The capacitance C1 is connected between a gate of an n-channel transistor 1001 and a node VDS.

Figure 17A:
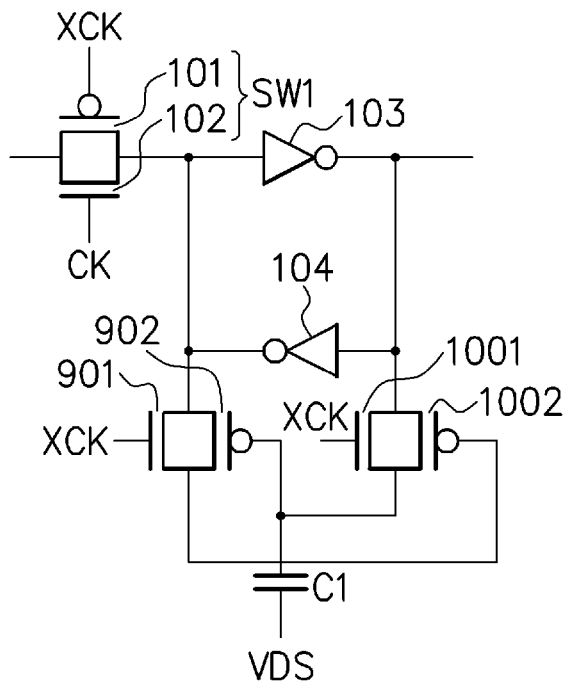
FIG. 17A to FIG. 17D are circuit diagrams depicting configuration examples of a semiconductor device having a latch circuit according to a fifteenth embodiment.

FIG. 17A is a circuit diagram depicting a configuration example of a semiconductor device having a latch circuit according to a fifteenth embodiment. In FIG. 17A, a capacitance C1 is added compared with FIG. 11A. The capacitance C1 is connected between a gate of a p-channel transistor 902 and a node VDS. By adding the capacitance C1 to a gate capacitance of the transistor 902, a soft error can be prevented more effectively.

Figure 17B:
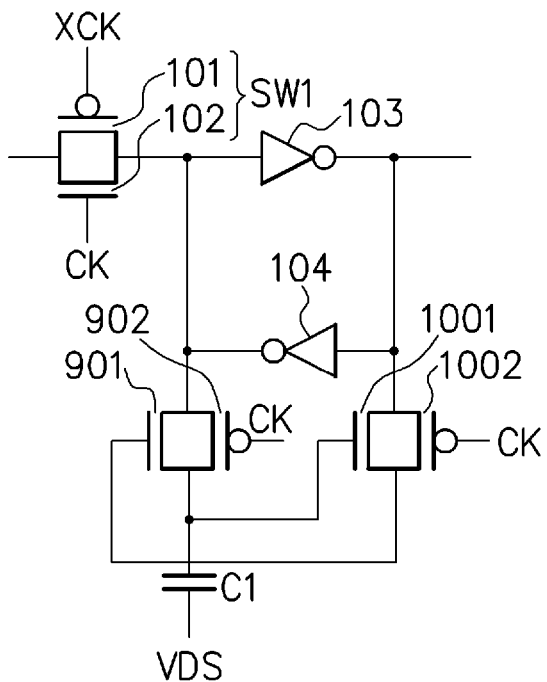

FIG. 17B is a circuit diagram depicting another configuration example of the semiconductor device having the latch circuit according to the present embodiment. In FIG. 17B, a capacitance C1 is added compared with FIG. 11B. The capacitance C1 is connected between a gate of an n-channel transistor 1001 and a node VDS.

Figure 17C:
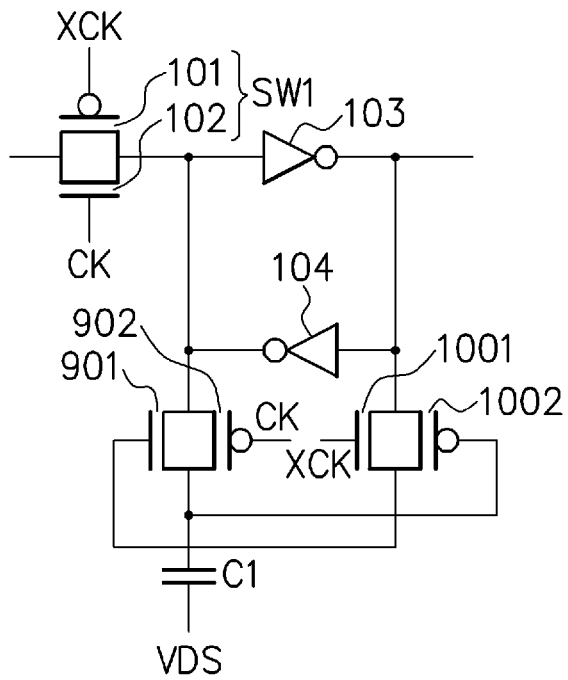

FIG. 17C is a circuit diagram depicting another configuration example of the semiconductor device having the latch circuit according to the present embodiment. In FIG. 17C, a capacitance C1 is added compared with FIG. 11C. The capacitance C1 is connected between a gate of a p-channel transistor 1002 and a node VDS.

Figure 17D:
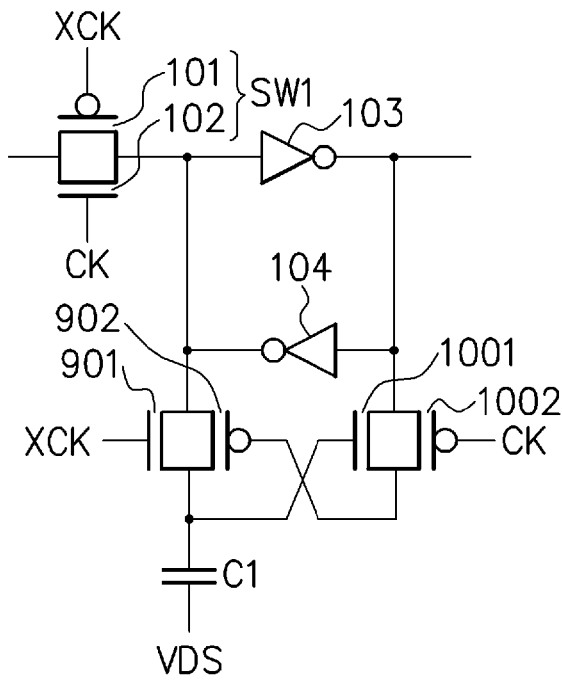

FIG. 17D is a circuit diagram depicting another configuration example of the semiconductor device having the latch circuit according to the present embodiment. In FIG. 17D, a capacitance C1 is added compared with FIG. 11D. The capacitance C1 is connected between a gate of an n-channel transistor 1001 and a node VDS.

FIG. 18A is a circuit diagram depicting a configuration example of a semiconductor device having a latch circuit according to a sixteenth embodiment. Hereinafter, a point of difference in FIG. 18A compared with FIG. 8E will be described. A gate and a source of a transistor 801 are connected to each other. By adding a gate capacitance of the transistor 801 to a capacitance C, a soft error can be prevented more effectively.

FIG. 18B is a circuit diagram depicting another configuration example of the semiconductor device having the latch circuit according to the present embodiment. Hereinafter, a point of difference in FIG. 18B compared with FIG. 8E will be described. A gate and a drain of a transistor 804 are connected to each other.

FIG. 18C is a circuit diagram depicting another configuration example of the semiconductor device having the latch circuit according to the present embodiment. Hereinafter, a point of difference in FIG. 18C compared with FIG. 8E will be described. A gate and a drain of a transistor 802 are connected to each other.

FIG. 18D is a circuit diagram depicting another configuration example of the semiconductor device having the latch circuit according to the present embodiment. Hereinafter, a point of difference in FIG. 18D compared with FIG. 8E will be described. A gate and a source of a transistor 803 are connected to each other.

FIG. 18E is a circuit diagram depicting another configuration example of the semiconductor device having the latch circuit according to the present embodiment. Hereinafter, a point of difference in FIG. 18E compared with FIG. 8B will be described. A gate and a source of a transistor 801 are connected to each other.

FIG. 18F is a circuit diagram depicting another configuration example of the semiconductor device having the latch circuit according to the present embodiment. Hereinafter, a point of difference in FIG. 18F compared with FIG. 8A will be described. A gate and a drain of a transistor 802 are connected to each other.

FIG. 19A is a circuit diagram depicting a configuration example of a semiconductor device having a latch circuit according to a seventeenth embodiment. Hereinafter, a point of difference in FIG. 19A compared with FIG. 8B will be described. A gate and a drain of a transistor 802 are connected to each other. By adding a gate capacitance of the transistor 802 to a capacitance C, a soft error can be prevented more effectively.

FIG. 19B is a circuit diagram depicting another configuration example of the semiconductor device having the latch circuit according to the present embodiment. Hereinafter, a point of difference in FIG. 19B compared with FIG. 8A will be described. A gate and a source of a transistor 801 are connected to each other.

FIG. 19C is a circuit diagram depicting another configuration example of the semiconductor device having the latch circuit according to the present embodiment. Hereinafter, a point of difference in FIG. 19C compared with FIG. 8D will be described. A gate and a source of a transistor 801 are connected to each other.

FIG. 19D is a circuit diagram depicting another configuration example of the semiconductor device having the latch circuit according to the present embodiment. Hereinafter, a point of difference in FIG. 19D compared with FIG. 8C will be described. A gate and a drain of a transistor 802 are connected to each other.

FIG. 19E is a circuit diagram depicting another configuration example of the semiconductor device having the latch circuit according to the present embodiment. Hereinafter, a point of difference in FIG. 19E compared with FIG. 8D will be described. A gate and a drain of a transistor 802 are connected to each other.

FIG. 19F is a circuit diagram depicting another configuration example of the semiconductor device having the latch circuit according to the present embodiment. Hereinafter, a point of difference in FIG. 19F compared with FIG. 8C will be described. A gate and a source of a transistor 801 are connected to each other.

Figure 20A:
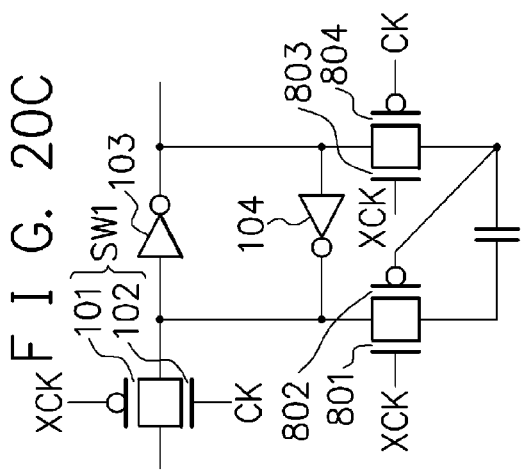
FIG. 20A to FIG. 20F are circuit diagrams depicting configuration examples of a semiconductor device having a latch circuit according to an eighteenth embodiment.

FIG. 20A is a circuit diagram depicting a configuration example of a semiconductor device having a latch circuit according to an eighteenth embodiment. Hereinafter, a point of difference in FIG. 20A compared with FIG. 8E will be described. A gate of a transistor 801 is connected to a source of a transistor 803. By adding a gate capacitance of the transistor 801 to a capacitance C, a soft error can be prevented more effectively.

Figure 20B:
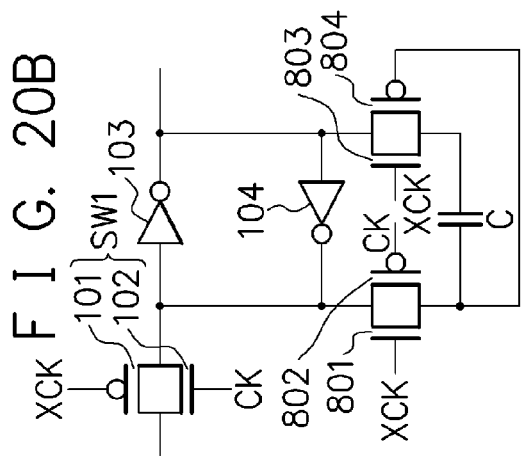

FIG. 20B is a circuit diagram depicting another configuration example of the semiconductor device having the latch circuit according to the present embodiment. Hereinafter, a point of difference in FIG. 20B compared with FIG. 8E will be described. A gate of a transistor 804 is connected to a drain of a transistor 802.

Figure 20C:
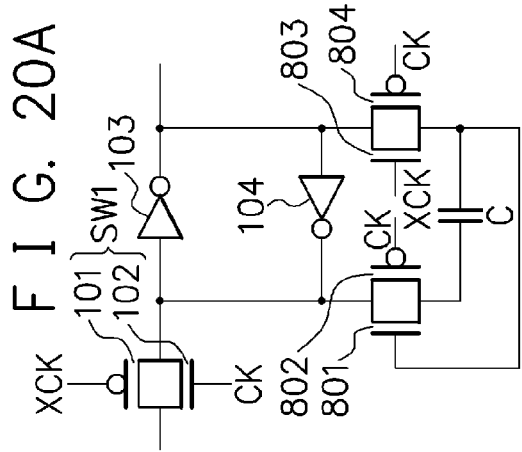

FIG. 20C is a circuit diagram depicting another configuration example of the semiconductor device having the latch circuit according to the present embodiment. Hereinafter, a point of difference in FIG. 20C compared with FIG. 8E will be described. A gate of a transistor 802 is connected to a drain of a transistor 804.

Figure 20D:
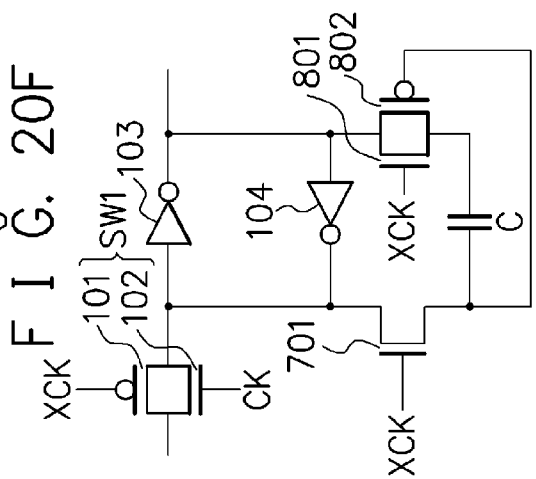

FIG. 20D is a circuit diagram depicting another configuration example of the semiconductor device having the latch circuit according to the present embodiment. Hereinafter, a point of difference in FIG. 20D compared with FIG. 8E will be described. A gate of a transistor 803 is connected to a source of a transistor 801.

Figure 20E:
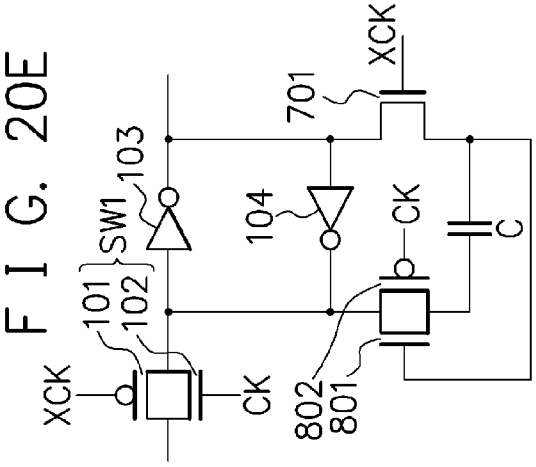

FIG. 20E is a circuit diagram depicting another configuration example of the semiconductor device having the latch circuit according to the present embodiment. Hereinafter, a point of difference in FIG. 20E compared with FIG. 8B will be described. A gate of a transistor 801 is connected to a source of a transistor 701.

Figure 20F:
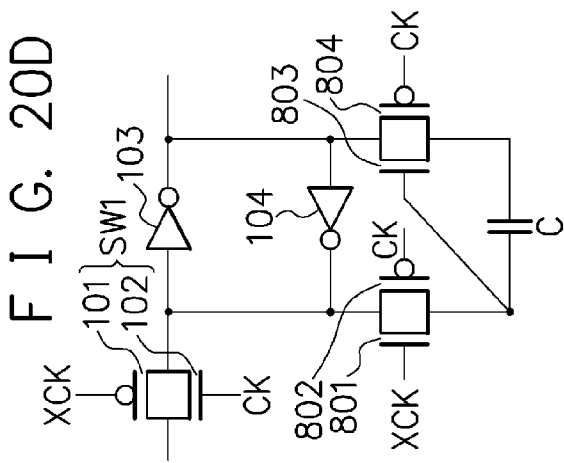

FIG. 20F is a circuit diagram depicting another configuration example of the semiconductor device having the latch circuit according to the present embodiment. Hereinafter, a point of difference in FIG. 20F compared with FIG. 8A will be described. A gate of a transistor 802 is connected to a source of a transistor 701.

FIG. 21A is a circuit diagram depicting a configuration example of a semiconductor device having a latch circuit according to a nineteenth embodiment. Hereinafter, a point of difference in FIG. 21A compared with FIG. 8B will be described. A gate of a transistor 802 is connected to a source of a transistor 701. By adding a gate capacitance of the transistor 802 to a capacitance C, a soft error can be prevented more effectively.

FIG. 21B is a circuit diagram depicting another configuration example of the semiconductor device having the latch circuit according to the present embodiment. Hereinafter, a point of difference in FIG. 21B compared with FIG. 8A will be described. A gate of a transistor 801 is connected to a source of a transistor 701.

FIG. 21C is a circuit diagram depicting another configuration example of the semiconductor device having the latch circuit according to the present embodiment. Hereinafter, a point of difference in FIG. 21C compared with FIG. 8D will be described. A gate of a transistor 801 is connected to a drain of a transistor 702.

FIG. 21D is a circuit diagram depicting another configuration example of the semiconductor device having the latch circuit according to the present embodiment. Hereinafter, a point of difference in FIG. 21D compared with FIG. 8C will be described. A gate of a transistor 802 is connected to a drain of a transistor 702.

FIG. 21E is a circuit diagram depicting another configuration example of the semiconductor device having the latch circuit according to the present embodiment. Hereinafter, a point of difference in FIG. 21E compared with FIG. 8D will be described. A gate of a transistor 802 is connected to a drain of a transistor 702.

FIG. 21F is a circuit diagram depicting another configuration example of the semiconductor device having the latch circuit according to the present embodiment. Hereinafter, a point of difference in FIG. 21F compared with FIG. 8C will be described. A gate of a transistor 801 is connected to a drain of a transistor 702.

Figure 22A:
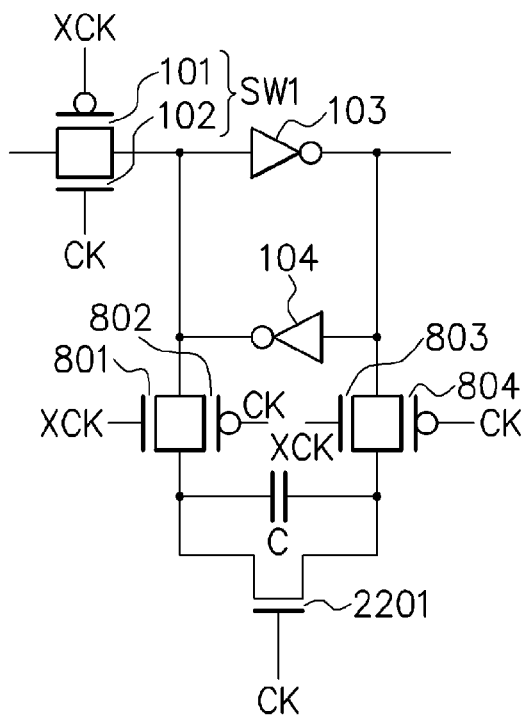
FIG. 22A to FIG. 22C are circuit diagrams depicting configuration examples of a semiconductor device having a latch circuit according to a twentieth embodiment.

FIG. 22A is a circuit diagram depicting a configuration example of a semiconductor device having a latch circuit according to a twentieth embodiment. In FIG. 22A, a transistor 2201 is added compared with FIG. 8E. A drain and a source of the n-channel transistor 2201 are connected to both ends of a capacitance C, while a gate thereof is connected to a clock signal CK. Without the transistor 2201, during a data write time Tw in which a switch SW1 is turned on, sometimes data of a data input terminal is not written into an input terminal (data holding node A) of an inverter 103 due to data stored in the capacitance C. An on/off operation of the transistor 2201 is the same as that of the switch SW1. During the data write time Tw, the switch SW1 and the transistor 2201 are turned on. As a result, an electric potential of the capacitance C can be made an intermediate potential. Thereby, during the data write time Tw, a charge of the capacitance C is prevented from inverting electric potentials of the input terminal (data holding node A) and an output terminal (data holding node B) of the inverter 103, so that writing can be performed stably.

Figure 22B:
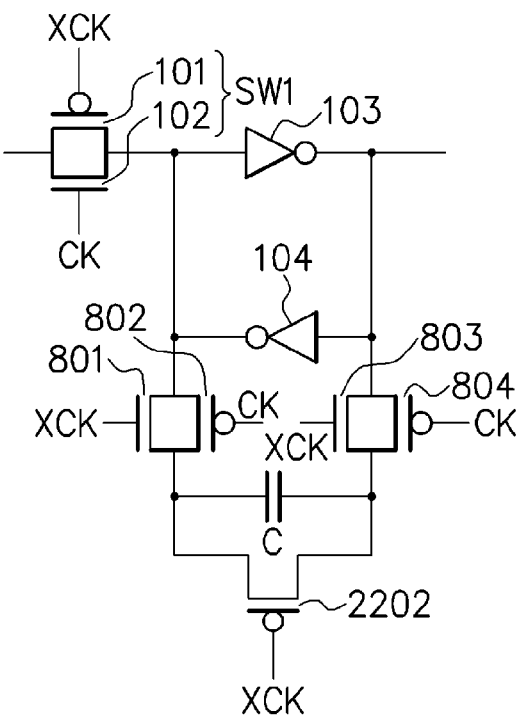

FIG. 22B is a circuit diagram depicting another configuration example of the semiconductor device having the latch circuit according to the present embodiment. In FIG. 22B, a transistor 2202 is added compared with FIG. 8E. A drain and a source of the p-channel transistor 2202 are connected to both ends of a capacitance C, while a gate thereof is connected to a clock signal XCK. Thereby, writing can be performed stably.

Figure 22C:
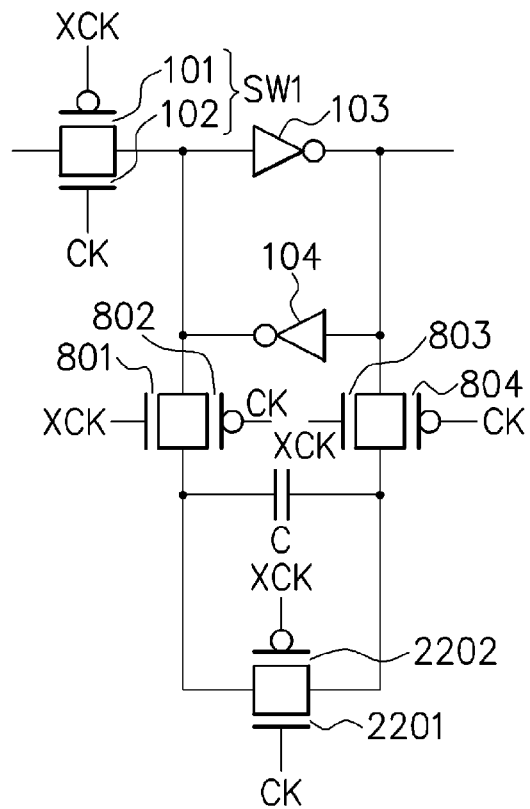

FIG. 22C is a circuit diagram depicting another configuration example of the semiconductor device having the latch circuit according to the present embodiment. In FIG. 22C, a transistor 2202 is added compared with FIG. 22A. A drain and a source of the p-channel transistor 2202 are connected to both ends of a capacitance C, while a gate thereof is connected to a clock signal XCK. Thereby, writing can be performed stably.

Figure 23A:
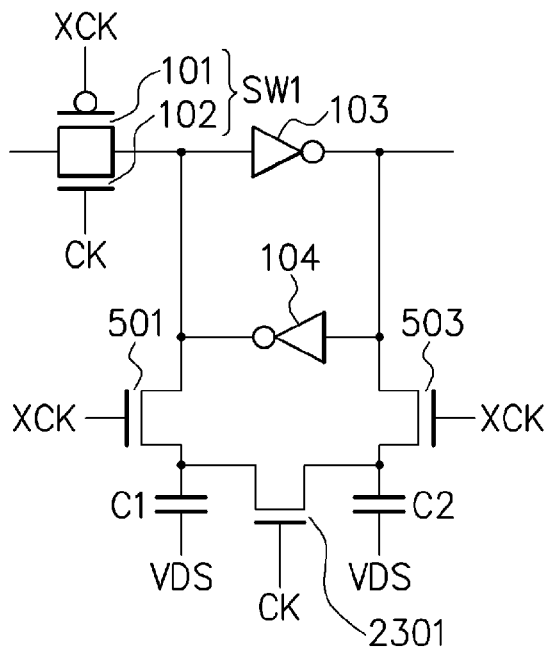
FIG. 23A to FIG. 23D are circuit diagrams depicting configuration examples of a semiconductor device having a latch circuit according to a twenty-first embodiment.

FIG. 23A is a circuit diagram depicting a configuration example of a semiconductor device having a latch circuit according to a twenty-first embodiment. In FIG. 23A, a transistor 2301 is added compared with FIG. 5E. A drain and a source of the n-channel transistor 2301 are connected to sources of transistors 501 and 503, while a gate thereof is connected to a clock signal CK. Similarly to the twentieth embodiment, providing the transistor 2301 enables capacitances C1 and C2 to be of intermediate potentials, and writing can be performed stably.

Figure 23B:
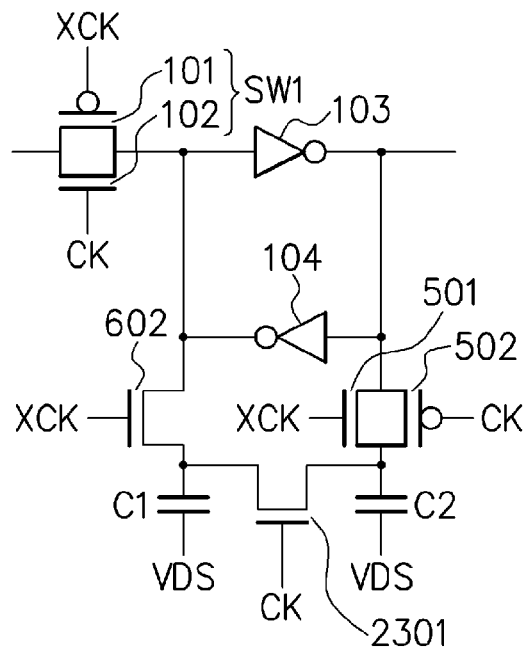

FIG. 23B is a circuit diagram depicting another configuration example of the semiconductor device having the latch circuit according to the present embodiment. In FIG. 23B, a transistor 2301 is added compared with FIG. 6B. A drain and a source of the n-channel transistor 2301 are connected to sources of transistors 602 and 501, while a gate thereof is connected to a clock signal CK. Providing the transistor 2301 enables capacitances C1 and C2 to be of intermediate potentials, and writing can be performed stably.

Figure 23C:
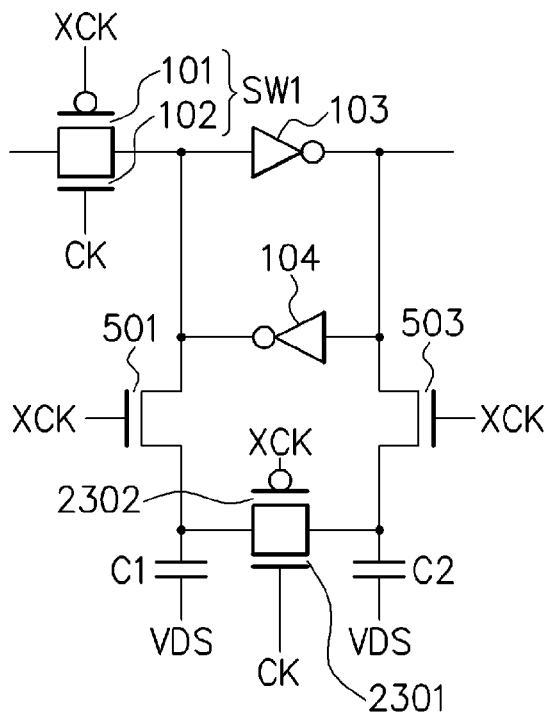

FIG. 23C is a circuit diagram depicting another configuration example of the semiconductor device having the latch circuit according to the present embodiment. In FIG. 23C, a transistor 2302 is added compared with FIG. 23A. A drain and a source of the p-channel transistor 2302 are connected to sources of transistors 501 and 503, while a gate thereof is connected to a clock signal XCK.

Figure 23D:
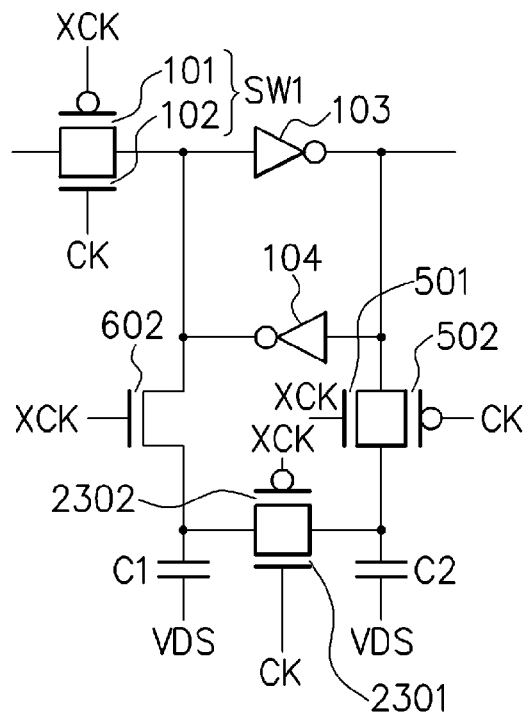

FIG. 23D is a circuit diagram depicting another configuration example of the semiconductor device having the latch circuit according to the present embodiment. In FIG. 23D, a transistor 2302 is added compared with FIG. 23B. A drain and a source of the p-channel transistor 2302 are connected to sources of transistors 602 and 501, while a gate thereof is connected to a clock signal XCK.

Figure 24A:
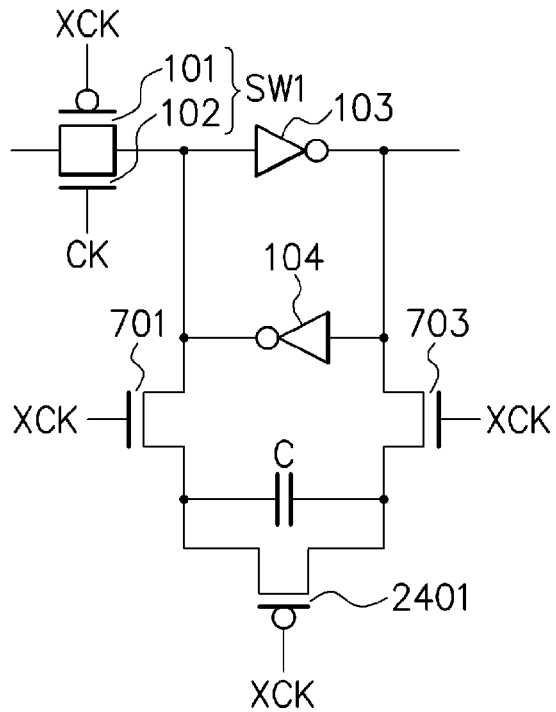
FIG. 24A to FIG. 24D are circuit diagrams depicting configuration examples of a semiconductor device having a latch circuit according to a twenty-second embodiment.

FIG. 24A is a circuit diagram depicting a configuration example of a semiconductor device having a latch circuit according to a twenty-second embodiment. In FIG. 24A, a transistor 2401 is added compared with FIG. 7C. A drain and a source of the p-channel transistor 2401 are connected to both ends of a capacitance C, while a gate thereof is connected to a clock signal XCK. Similarly to the twentieth embodiment, providing the transistor 2401 enables the capacitance C to be of an intermediate potential, and writing can be performed stably.

Figure 24B:
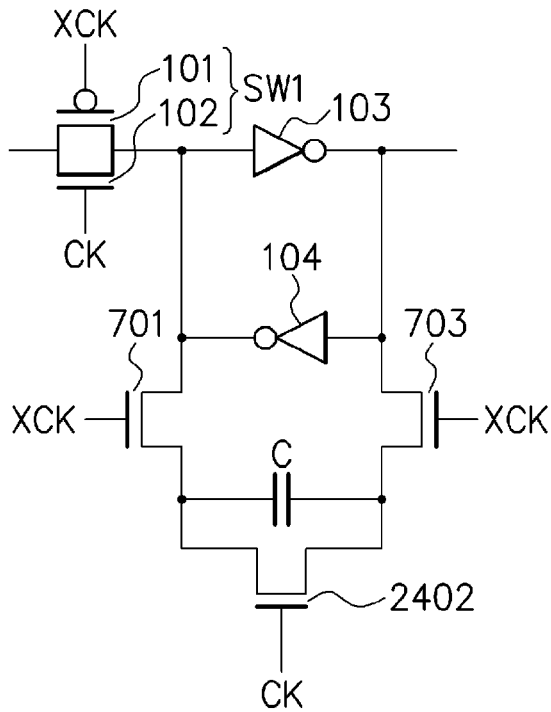

FIG. 24B is a circuit diagram depicting another configuration example of the semiconductor device having the latch circuit according to the present embodiment. In FIG. 24B, a transistor 2402 is added compared with FIG. 7C. A drain and a source of the n-channel transistor 2402 are connected to both ends of a capacitance C, while a gate thereof is connected to a clock signal CK. Providing the transistor 2402 enables the capacitance C to be of an intermediate potential, and writing can be performed stably.

Figure 24C:
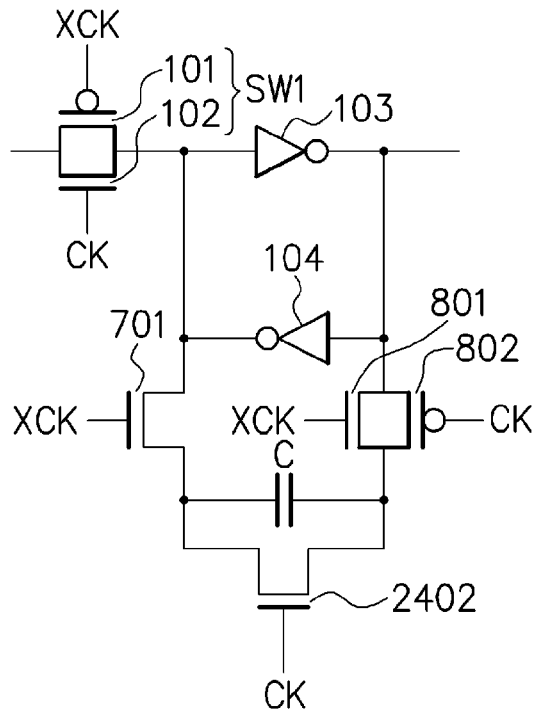

FIG. 24C is a circuit diagram depicting another configuration example of the semiconductor device having the latch circuit according to the present embodiment. In FIG. 24C, a transistor 2402 is added compared with FIG. 8A. A drain and a source of the n-channel transistor 2402 are connected to both ends of a capacitance C, while a gate thereof is connected to a clock signal CK. Providing the transistor 2402 enables the capacitance C to be of an intermediate potential, and writing can be performed stably.

Figure 24D:
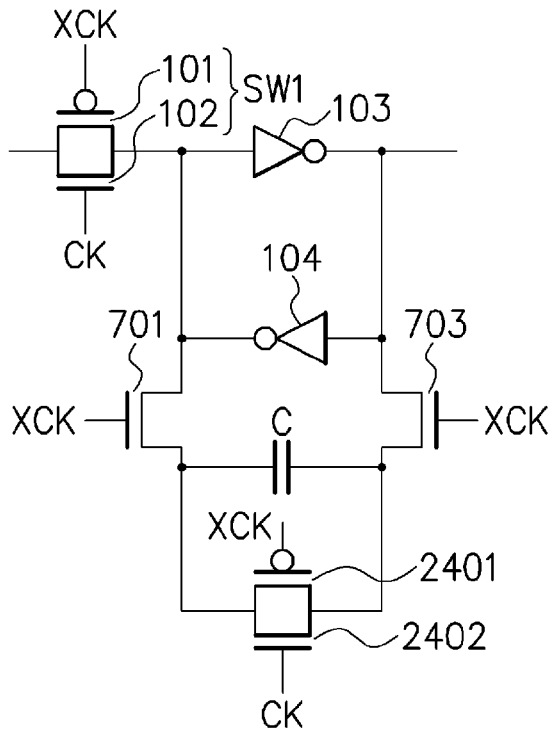

FIG. 24D is a circuit diagram depicting another configuration example of the semiconductor device having the latch circuit according to the present embodiment. In FIG. 24D, a transistor 2402 is added compared with FIG. 24A. A drain and a source of the n-channel transistor 2402 are connected to both ends of a capacitance C, while a gate thereof is connected to a clock signal CK.

Figure 25A:
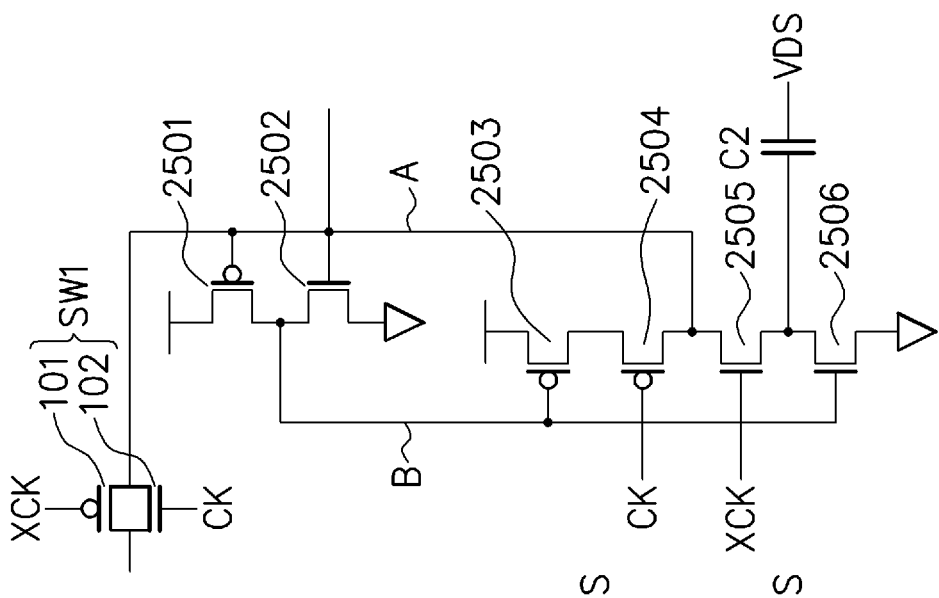
FIG. 25A to FIG. 25C are circuit diagrams depicting configuration examples of a semiconductor device having a latch circuit according to a twenty-third embodiment.

FIG. 25A is a circuit diagram depicting a configuration example of a semiconductor device having a latch circuit according to a twenty-third embodiment. Similarly to FIG. 1A, a switch SW1 is connected between a data input terminal and a data holding node A. Transistors 2501 and 2502 correspond to the inverter 103 of FIG. 1B. Transistors 2503 to 2506 correspond to the clock gate 114 of FIG. 1B. A capacitance C1 corresponds to the capacitance C of FIG. 1A.

A source of the p-channel transistor 2501 is connected to a power supply voltage, a gate thereof is connected to the data holding node A, and a drain thereof is connected to a data holding node B. A drain of the n-channel transistor 2502 is connected to the data holding node B, a gate thereof is connected to the data holding node A, and a source thereof is connected to a reference potential (ground potential).

A source of the p-channel transistor 2503 is connected to the power supply voltage, a gate thereof is connected to the data holding node B, and a drain thereof is connected to a source of the p-channel transistor 2504. A gate of the p-channel transistor 2504 is connected to a clock signal CK, while a drain thereof is connected to the data holding node A. A drain of the n-channel transistor 2505 is connected to the data holding node A, a gate thereof is connected to a clock signal XCK, and a source thereof is connected to a drain of the n-channel transistor 2506. A gate of the n-channel transistor 2506 is connected to the data holding node B, while a source thereof is connected to a reference potential.

The capacitance C1 is connected between the drain of the p-channel transistor 2503 and a node VDS.

During a data hold time Th, the switch SW1 is turned off and the transistors 2504 and 2505 are turned on. Then, the transistors 2503 and 2506 have the same configuration as that of the inverter 104 of FIG. 1A, and the capacitance C1 is connected to an output terminal of an inverter of the transistors 2503 and 2506. Thereby, the same operation as that in FIG. 1A is performed.

In contrast, during a data write time Tw, the switch SW1 is turned on and the transistors 2504 and 2505 are turned off. Then, the output terminal of the inverter of the transistors 2503 and 2506 is disconnected from the data holding node A and the capacitance C1. Thereby, similarly to a case of FIG. 1A, delay of data writing speed can be prevented.

Figure 25B:
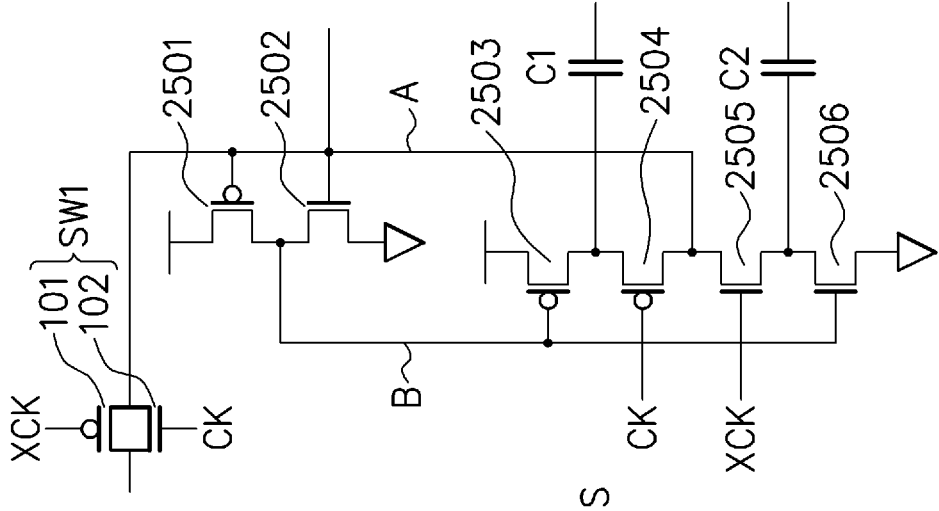

FIG. 25B is a circuit diagram depicting another configuration example of the semiconductor device having the latch circuit according to the present embodiment. In FIG. 25B, a capacitance C2 is added compared with FIG. 25A. The capacitance C2 is connected between a source of the n-channel transistor 2505 and a node VDS. During a data hold time Th, since capacitances C1 and C2 are connected to an output terminal of an inverter of transistors 2503 and 2506, a soft error can be prevented more effectively.

Figure 25C:
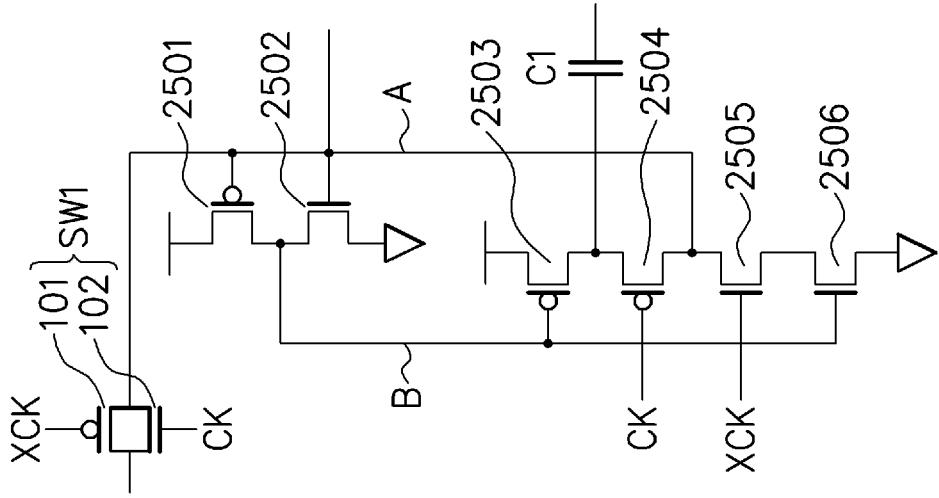

FIG. 25C is a circuit diagram depicting another configuration example of the semiconductor device having the latch circuit according to the present embodiment. In FIG. 25C, a capacitance C2 is provided instead of the capacitance C1 compared with FIG. 25A. The capacitance C2 is connected between a source of the n-channel transistor 2505 and a node VDS.

FIG. 26A is a circuit diagram depicting a configuration example of a semiconductor device having a latch circuit according to a twenty-fourth embodiment. In FIG. 26A, a transistor 2601 is added compared with FIG. 25A. A drain of the n-channel transistor 2602 is connected to a capacitance C1, a gate thereof is connected to a clock signal XCK, and a source thereof is connected to a data holding node B.

FIG. 26B is a circuit diagram depicting another configuration example of the semiconductor device having the latch circuit according to the present embodiment. In FIG. 26B, a transistor 2601 is added compared with FIG. 25B. A drain of the re-channel transistor 2601 is connected to a capacitance C2, a gate thereof is connected to a clock signal XCK, and a source thereof is connected to a data holding node B.

FIG. 26C is a circuit diagram depicting another configuration example of the semiconductor device having the latch circuit according to the present embodiment. In FIG. 26C, a transistor 2601 is added compared with FIG. 25C. A drain of the re-channel transistor 2601 is connected to a capacitance C2, a gate thereof is connected to a clock signal XCK, and a source thereof is connected to a data holding node B.

Figure 27A:
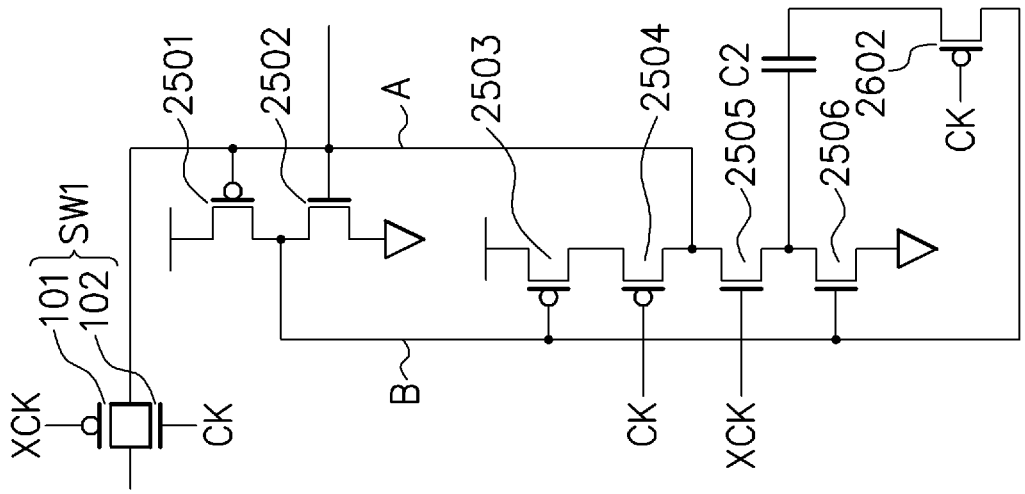
FIG. 27A to FIG. 27C are circuit diagrams depicting configuration examples of a semiconductor device having a latch circuit according to a twenty-fifth embodiment.

FIG. 27A is a circuit diagram depicting a configuration example of a semiconductor device having a latch circuit according to a twenty-fifth embodiment. In FIG. 27A, a transistor 2602 is added compared with FIG. 25A. A source of the p-channel transistor 2602 is connected to a capacitance C1, a gate thereof is connected to a clock signal CK, and a drain thereof is connected to a data holding node B.

Figure 27B:
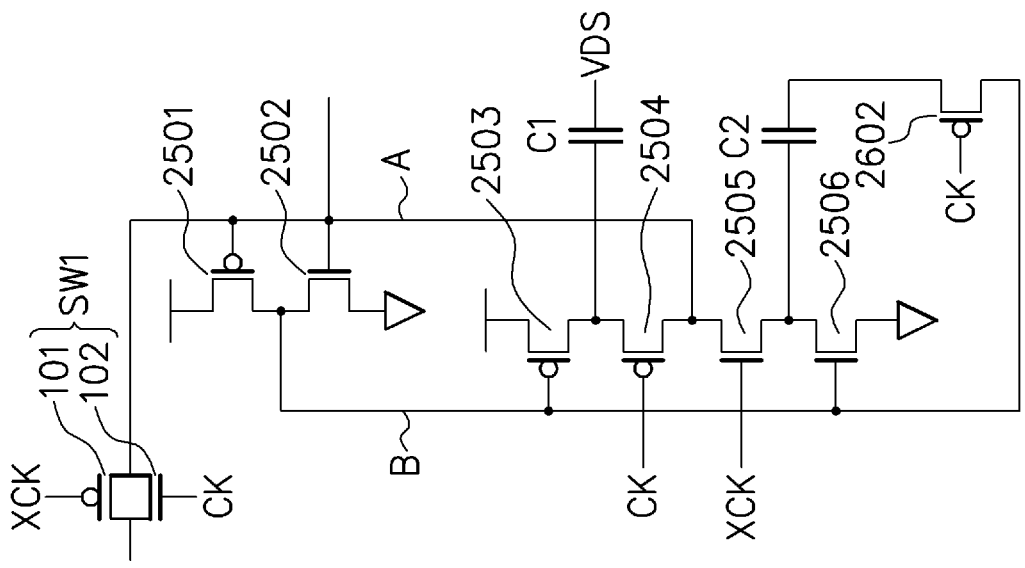

FIG. 27B is a circuit diagram depicting another configuration example of the semiconductor device having the latch circuit according to the present embodiment. In FIG. 27B, a transistor 2602 is added compared with FIG. 25A. A source of the p-channel transistor 2602 is connected to a capacitance C2, a gate thereof is connected to a clock signal CK, and a drain thereof is connected to a data holding node B.

Figure 27C:
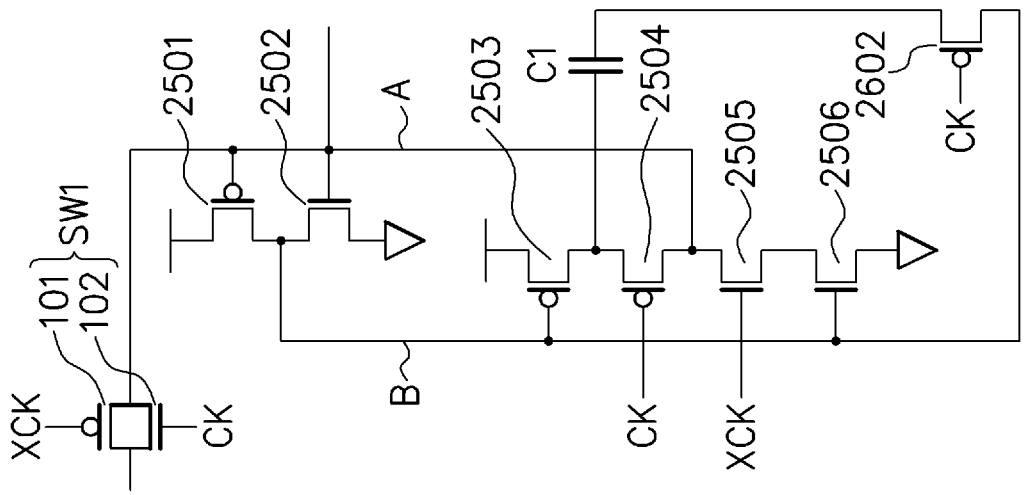

FIG. 27C is a circuit diagram depicting another configuration example of the semiconductor device having the latch circuit according to the present embodiment. In FIG. 27C, a transistor 2602 is added compared with FIG. 25C. A source of the p-channel transistor 2602 is connected to a capacitance C2, a gate thereof is connected to a clock signal CK, and a drain thereof is connected to a data holding node B.

FIG. 28A is a circuit diagram depicting a configuration example of a semiconductor device having a latch circuit according to a twenty-sixth embodiment. In FIG. 28A, a transistor 2602 is added compared with FIG. 26A. A source of the p-channel transistor 2602 is connected to a capacitance C1, a gate thereof is connected to a clock signal CK, and a drain thereof is connected to a data holding node B.

FIG. 28B is a circuit diagram depicting another configuration example of the semiconductor device having the latch circuit according to the present embodiment. In FIG. 28B, a transistor 2602 is added compared with FIG. 26B. A source of the p-channel transistor 2602 is connected to a capacitance C2, a gate thereof is connected to a clock signal CK, and a drain thereof is connected to a data holding node B.

FIG. 28C is a circuit diagram depicting another configuration example of the semiconductor device having the latch circuit according to the present embodiment. In FIG. 28C, a transistor 2602 is added compared with FIG. 26C. A source of the p-channel transistor 2602 is connected to a capacitance C2, a gate thereof is connected to a clock signal CK, and a drain thereof is connected to a data holding node B.

Figure 29A:
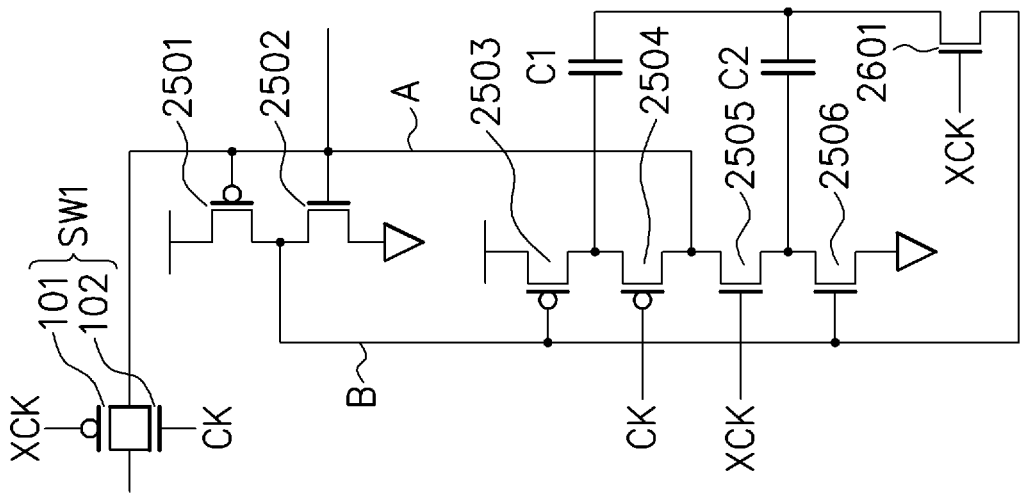
FIG. 29A to FIG. 29C are circuit diagrams depicting configuration examples of a semiconductor device having a latch circuit according to a twenty-seventh embodiment.

FIG. 29A is a circuit diagram depicting a configuration example of a semiconductor device having a latch circuit according to a twenty-seventh embodiment. Hereinafter, a point of difference in FIG. 29A compared with FIG. 28B will be described. A capacitance C1 together with a capacitance C2 is connected to transistors 2601 and 2602.

Figure 29B:
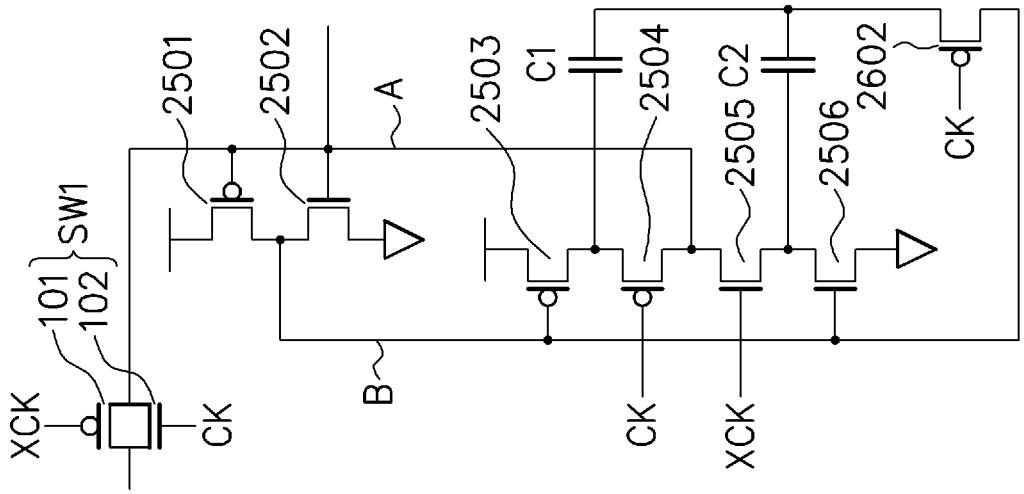

FIG. 29B is a circuit diagram depicting another configuration example of the semiconductor device having the latch circuit according to the present embodiment. Hereinafter, a point of difference in FIG. 29B compared with FIG. 27B will be described. A capacitance C1 together with a capacitance C2 is connected to a transistor 2602.

Figure 29C:
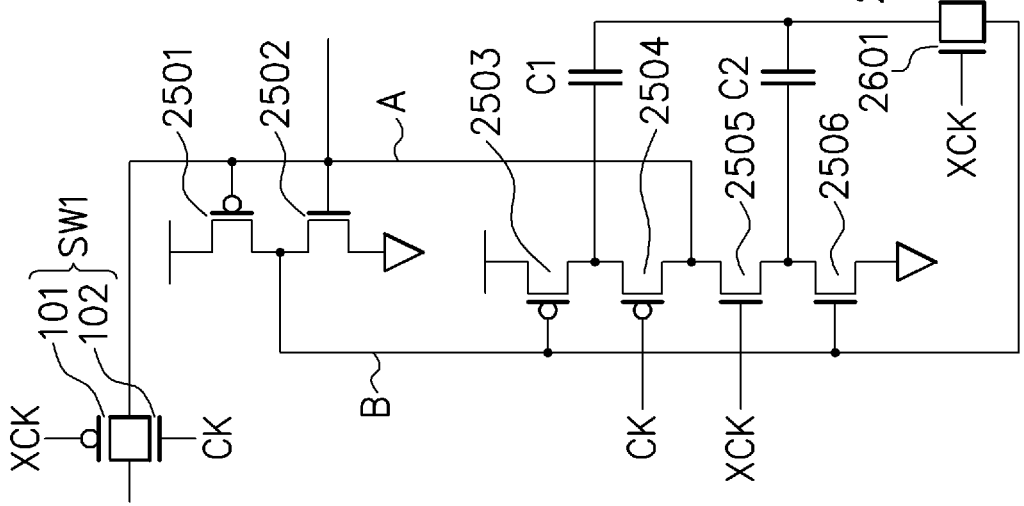

FIG. 29C is a circuit diagram depicting another configuration example of the semiconductor device having the latch circuit according to the present embodiment. Hereinafter, a point of difference in FIG. 29C compared with FIG. 26B will be described. A capacitance C1 together with a capacitance C2 is connected to a transistor 2601.

FIG. 30A is a circuit diagram depicting a configuration example of a semiconductor device having a latch circuit according to a twenty-eighth embodiment. Hereinafter, a point of difference in FIG. 30A compared with FIG. 29B will be described. A capacitance C2 is connected between a source of a transistor 2505 and a node VDS.

FIG. 30B is a circuit diagram depicting another configuration example of the semiconductor device having the latch circuit according to the present embodiment. Hereinafter, a point of difference in FIG. 30B compared with FIG. 29A will be described. A capacitance C2 is connected between a source of a transistor 2505 and a node VDS.

FIG. 30C is a circuit diagram depicting another configuration example of the semiconductor device having the latch circuit according to the present embodiment. Hereinafter, a point of difference in FIG. 30C compared with FIG. 29C will be described. A capacitance C2 is connected between a source of a transistor 2505 and a node VDS.

Figure 31:
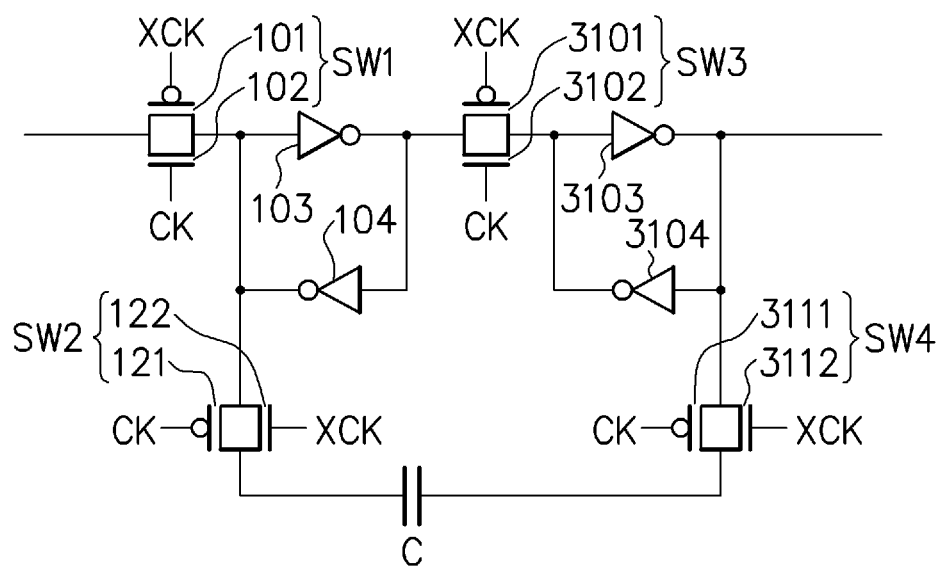
FIG. 31 is a circuit diagram depicting a configuration example of a semiconductor device having a latch circuit according to a twenty-ninth embodiment.
Figure 32:
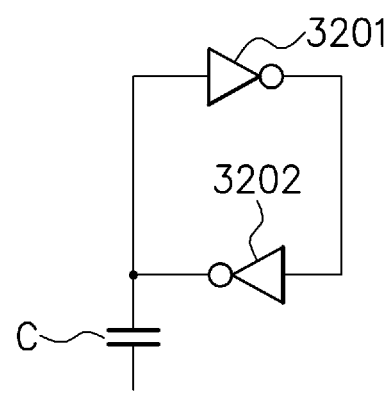
FIG. 32 is a circuit diagram depicting a configuration example of a latch circuit.

FIG. 31A is a circuit diagram depicting a configuration example of a semiconductor device having a latch circuit according to a twenty-ninth embodiment. Hereinafter, a point of difference in FIG. 31 compared with FIG. 29B will be described. A switch SW3 is constituted by an n-channel transistor 3101 and a p-channel transistor 3102 and is connected between an output terminal of an inverter 103 and an input terminal of an inverter 3103. An input terminal of an inverter 3104 is connected to an output terminal of the inverter 3103 and an output terminal thereof is connected to the input terminal of the inverter 3103. A switch SW4 is constituted by a p-channel transistor 3111 and an n-channel transistor 3112 and is connected between the output terminal of the inverter 3103 and a capacitance C. The capacitance C is connected between a switch SW2 and the switch SW4.

The present embodiment presents a semiconductor device using two latch circuits. Inverters 103 and 104 constitute a master latch circuit. The inverters 3103 and 3104 constitute a slave latch circuit. The master latch circuit and the slave latch circuit constitute a loop circuit and use the capacitance C in common within the loop circuit. By providing the capacitance C, a soft error can be prevented similarly to the above.

As described above, in the first to twenty-second embodiment, the capacitance is connected to one or more of the data holding nodes A and B of the latch circuit, and an element by which switching is possible such as a transistor and a transmission gate is connected between the connecting node and the connected capacitance. However, it is necessary that the capacitance has a capacitance enough for the sum of this capacitance and an original capacitance of the data holding node A or B of the latch circuit may become larger than an electric charge amount which is generated by radiation incidence of an alpha ray or the like and collected.

By the operation clock signals CK, XCK and the like in the latch circuit, the semiconductor device turns on that switch during the data write time Tw, thereby electrically disconnecting the data holding node A or B and the capacitance. The semiconductor device turns off that switch during the data hold time Th, thereby connecting the data holding node A or B and the capacitance.

In the latch circuit, during the data write time Tw, the switch (transmission gate or the like) connected between the data holding node A or B and the capacitance is turned on, whereby the data holding node A or B and the capacitance is not electrically connected. Thus, an electric capacitance of the data holding node A or B of the latch circuit during the data write time Tw is the same as a capacitance of a general latch circuit. In other words, in a writing operation, there is little degradation of a performance (set up time) by the above-described embodiments.

As a result that the switch (transmission gate or the like) connected between the data holding node A or B and the capacitance during the data hold time Th, the data holding node A or B and the capacitance are electrically connected and an electric capacitance of the data holding node A or B of the latch circuit becomes large. Thereby, the electric capacitance of the data holding node A or B becomes larger than usual, a voltage is hard to be changed even if an electric charge is generated in the data holding node A or B by a radiation such as an alpha ray. In other words, inversion of hold data is suppressed and a soft error prevention effect is realized.

The semiconductor device according to the first to twenty-second embodiment has: a latch circuit 103, 104 having a plurality of data holding nodes A, B; a first capacitance element C1 or the like connected to the first data holding node included in the plural data holding nodes; and a first switch element SW2 or the like provided between the first data holding node and the first capacitance element.

The semiconductor device according to the first to twenty-second embodiment further has: a second switch element SW1 provided in a data input line of the latch circuit; and a clock generation circuit (FIG. 1E) controlling the first switch element SW2 and the second switch element SW1.

As depicted in FIG. 2A, FIG. 2B, FIG. 3A, and FIG. 3B, the clock generation circuit turns off the first switch element SW2 in at least part of a time period during which the second switch element SW1 is in an ON state.

The latch circuit has a loop circuit which includes a plurality of inverters 103 and 104.

As depicted in FIG. 20A to FIG. 20F, the first switch element SW2 is constituted by a MOS field-effect transistor, and a storing electrode which is not connected to the first data holding node among storing electrodes of the first capacitance element C is connected to a gate electrode of the MOS field-effect transistor.

As depicted in FIG. 7A to FIG. 7D, the storing electrode which is not connected to the first data holding node among the storing electrodes of the first capacitance element C is connected to the second data holding node different from the first data holding node among the plural data holding nodes via a third switch element.

As depicted in FIG. 2A and FIG. 2B, the first switch element SW2 is turned off when the second switch element SW1 is in an ON state and is turned on when the second switch element SW1 is in an OFF state.

As depicted in FIG. 6A to FIG. 6D, the semiconductor device according to the first to twenty-second embodiment further has: a second capacitance element connected to the second data holding node different from the first data holding node among the plural data holding nodes; and a second switch element provided between the second data holding node and the second capacitance element.

As depicted in FIG. 25A to FIG. 25C and the like, a semiconductor device according to twenty-third to twenty-ninth embodiment has: a first inverter 2501, 2502; first and second p-channel MOS field-effect transistors 2503, 2504 connected in series between a power supply voltage node and an input terminal of the first inverters 2501, 2502; first and second n-channel MOS field-effect transistors 2505, 2506 connected in series between the input terminal of the first inverters 2501, 2502 and a reference potential node; and a first capacitance element C1 or C2 connected to an interconnection node of the first and second p-channel MOS field-effect transistors 2503, 2506 or an interconnection node of the first and second re-channel MOS field-effect transistors 2505, 2506, wherein gates of the first p-channel MOS field-effect transistor 2503 and the second n-channel MOS field-effect transistor 2506 are connected to an output terminal of the first inverter 2501, 2502, and wherein gates of the second p-channel MOS field-effect transistor 2504 and the first n-channel MOS field-effect transistor 2505 are connected to nodes of clock signals CK and XCK which are inverted to each other.

As depicted in FIG. 25B and the like, the first capacitance element C1 is connected to an interconnection node of the first and second p-channel MOS field-effect transistors 2503, 2504, and the semiconductor device according to the twenty-third to twenty-ninth embodiments further has a second capacitance element C2 connected to an interconnection node of the first and second re-channel MOS field-effect transistors 2505, 2506.

It should be noted that all of the above-described embodiments merely give the concrete examples for carrying out the present invention, and the technical scope of the present invention should not be construed in a restrictive manner by these embodiments. That is, the present invention can be carried out in various forms without departing from the technical spirit thereof or the main features thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

During a data hold time of a latch circuit, by connecting a first capacitance element by a first switch element, a soft error can be prevented. Further, in a data write time of the latch circuit, by disconnecting the first capacitance element by the first switch element, delay of data writing speed can be prevented.

What is claimed is:

1. A semiconductor device comprising:
   a first inverter;
   a first switch coupled between an input terminal of the first inverter and a data input terminal;
   first and second p-channel MOS field-effect transistors coupled in series between a power supply voltage node and an input terminal of the first inverter;
   first and second n-channel MOS field-effect transistors coupled in series between the input terminal of the first inverter and a reference potential node;
   a first capacitance element coupled to an interconnection node of the first and second n-channel MOS field-effect transistors; and
   a second switch coupled in series to the first capacitance element,
   wherein the first capacitance element and the second switch are coupled in series between the interconnection node of the first and second n-channel MOS field-effect transistors and an output terminal of the first inverter,
   wherein gates of the first p-channel MOS field-effect transistor and the second n-channel MOS field-effect transistor are coupled to the output terminal of the first inverter, wherein gates of the second p-channel MOS field-effect transistor and the first n-channel MOS field-effect transistor are coupled to nodes of clock signals which are inverted to each other, wherein the second p-channel MOS field-effect transistor and the first n-channel MOS field-effect transistor are turned off when the first switch is turned on, wherein the second p-channel MOS field-effect transistor and the first n-channel MOS field-effect transistor are turned on when the first switch is turned off, wherein the second switch is turned off when the first switch is turned on, and wherein the second switch is turned on when the first switch is turned off.

2. The semiconductor device according to claim 1, wherein the first capacitance element is coupled to the interconnection node of the first and second p-channel MOS field-effect transistors, and further comprising:

a second capacitance element coupled between an interconnection node of the first and second p-channel MOS field-effect transistors and the reference potential node or the power supply voltage node.

3. The semiconductor device according to claim 1, wherein the first capacitance element is coupled between the interconnection node of the first and second n-channel MOS field-effect transistors and the second switch, and further comprising:

a second capacitance element coupled between an interconnection node of the first and second p-channel MOS field-effect transistors and an interconnection node of the first capacitance element and the second switch.

4. A semiconductor device comprising:

a first inverter;

a first switch coupled between an input terminal of the first inverter and a data input terminal;

first and second p-channel MOS field-effect transistors coupled in series between a power supply voltage node and the input terminal of the first inverter;

first and second n-channel MOS field-effect transistors coupled in series between the input terminal of the first inverter and a reference potential node;

a first capacitance element coupled to an interconnection node of the first and second p-channel MOS field-effect transistors; and a second switch coupled in series to the first capacitance element, wherein the first capacitance element and the second switch are coupled in series between the interconnection node of the first and second p-channel MOS field-effect transistors and an output terminal of the first inverter, wherein gates of the first p-channel MOS field-effect transistor and the second n-channel MOS field-effect transistor are coupled to the output terminal of the first inverter, wherein gates of the second p-channel MOS field-effect transistor and the first n-channel MOS field-effect transistor are coupled to nodes of clock signals which are inverted to each other, wherein the second p-channel MOS field-effect transistor and the first n-channel MOS field-effect transistor are turned off when the first switch is turned on, wherein the second p-channel MOS field-effect transistor and the first n-channel MOS field-effect transistor are turned on when the first switch is turned off, wherein the second switch is turned off when the first switch is turned on, and wherein the second switch is turned on when the first switch is turned off.

5. The semiconductor device according to claim 4, further comprising:

a second capacitance element coupled between an interconnection node of the first and second n-channel MOS field-effect transistors and the reference potential node or the power supply voltage node.

* * * * *